US012628675B2

(12) United States Patent
Tominaga

(10) Patent No.: US 12,628,675 B2
(45) Date of Patent: May 12, 2026

(54) COMPONENT MOUNTING SUBSTRATE

(71) Applicant: MEKTEC CORPORATION, Tokyo (JP)

(72) Inventor: Azumi Tominaga, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 443 days.

(21) Appl. No.: 18/557,526

(22) PCT Filed: Oct. 5, 2022

(86) PCT No.: PCT/JP2022/037296
§ 371 (c)(1),
(2) Date: Oct. 26, 2023

(87) PCT Pub. No.: WO2023/162320
PCT Pub. Date: Aug. 31, 2023

(65) Prior Publication Data
US 2024/0213136 A1 Jun. 27, 2024

(30) Foreign Application Priority Data

Feb. 24, 2022 (JP) ................................. 2022-026935

(51) Int. Cl.
H10W 70/05 (2026.01)
G06K 19/07 (2006.01)
(Continued)

(52) U.S. Cl.
CPC ........ H10W 70/65 (2026.01); G06K 19/0723 (2013.01); H10W 70/05 (2026.01);
(Continued)

(58) Field of Classification Search
CPC ..... H10W 70/65; H10W 70/05; H10W 70/68; H10W 74/114; H10W 70/66;
(Continued)

(56) References Cited

U.S. PATENT DOCUMENTS

2013/0036802 A1 2/2013 Johnson et al.
2020/0405546 A1 12/2020 Naito et al.

FOREIGN PATENT DOCUMENTS

JP 2006-350513 A 12/2006
JP 2014-529732 A 11/2014
(Continued)

OTHER PUBLICATIONS

An Office Action, "Notice of Reasons for Refusal," mailed by the Japanese Patent Office on Feb. 3, 2026, which corresponds to Japanese Patent Application No. 2022-026935 and is related to U.S. Appl. No. 18/557,526; with English language translation.

(Continued)

*Primary Examiner* — Elias Ullah
(74) *Attorney, Agent, or Firm* — Studebaker Brackett PLLC

(57) ABSTRACT

Provided is a component mount board having a structure capable of more reliably sensing a state of the component mount board being soaked in liquid. A component mount board 100 includes a board 10 having a base 11, a first conductive pattern 30 formed on the base 11, and a mount component 50 electrically connected to the first conductive pattern 30 and a second conductive pattern 40 forming a circuit 60 together with the first conductive pattern 30 in a complementary manner. A portion of the base 11 corresponding to the second conductive pattern 40 is a missing portion 12 where the base 11 is missing. The second conductive pattern 40 is soluble in liquid, or is weakened when becoming wet with liquid.

16 Claims, 17 Drawing Sheets

100

(51) Int. Cl.
    *H10W 70/65*          (2026.01)
    *H10W 70/68*          (2026.01)
    *H10W 74/10*          (2026.01)
    *H10W 70/66*          (2026.01)

(52) U.S. Cl.
    CPC .......... *H10W 70/68* (2026.01); *H10W 74/114*
                (2026.01); *H10W 70/66* (2026.01)

(58) Field of Classification Search
    CPC ......... G06K 19/0723; G06K 19/07749; G06K
                19/07754; B32B 2255/205; B32B
                2307/202; B32B 2457/08; B32B 5/022;
                B32B 5/266; B32B 7/12; A61F 5/44;
                H05K 1/02; G01N 27/02
    See application file for complete search history.

(56)                 References Cited

FOREIGN PATENT DOCUMENTS

| | | |
|---|---|---|
| JP | 2020-190473 A | 11/2020 |
| JP | 2021-050958 A | 4/2021 |
| JP | 2021-056076 A | 4/2021 |
| JP | 2021-067660 A | 4/2021 |
| JP | 2021-197466 A | 12/2021 |
| JP | 2022-095351 A | 6/2022 |
| WO | 2019/107165 A1 | 6/2019 |

OTHER PUBLICATIONS

International Search Report issued in PCT/JP2022/037296; mailed
Dec. 20, 2022.

FIG. 6
(a)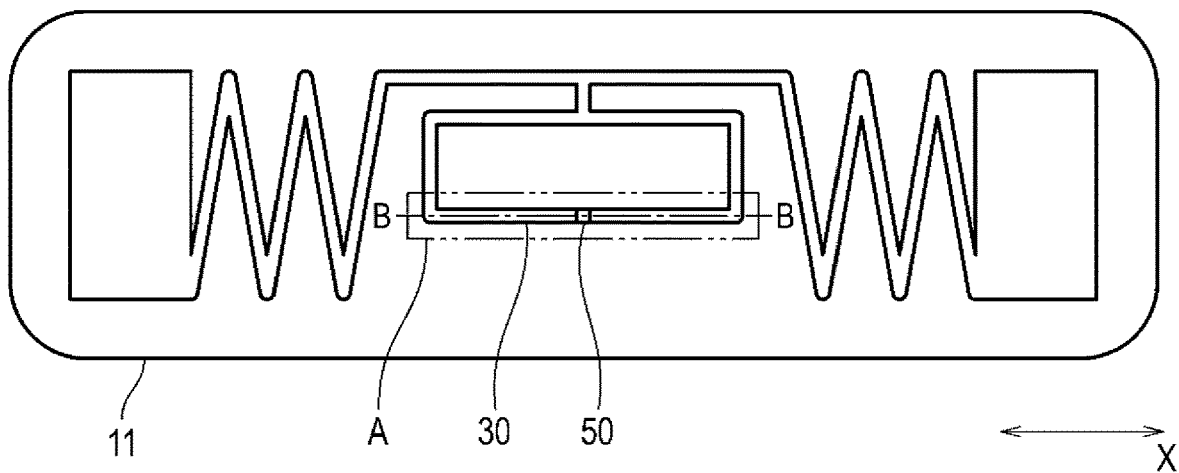
(b)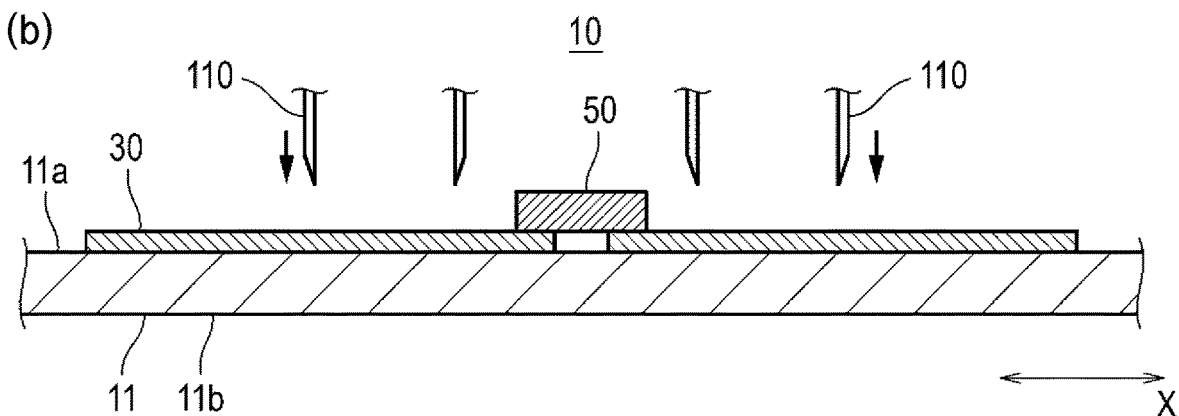
(c)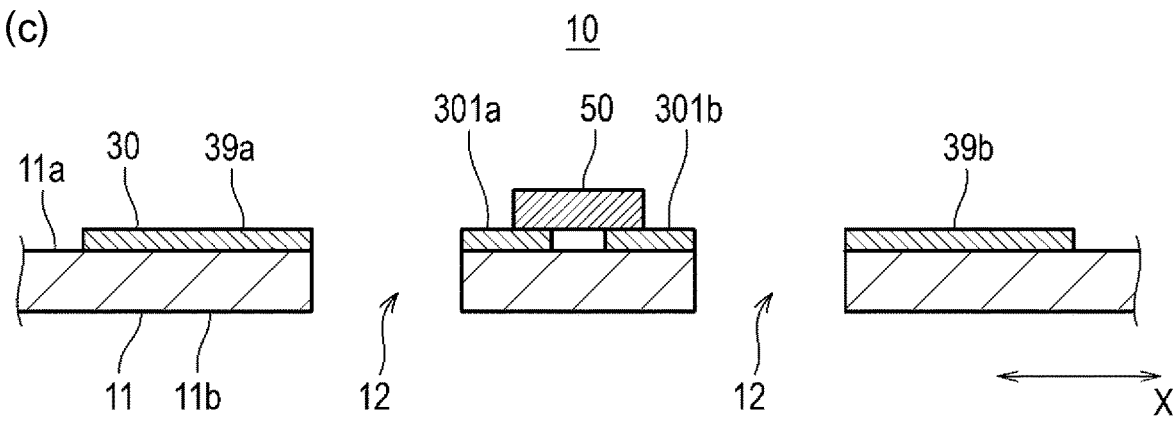

*FIG. 16*
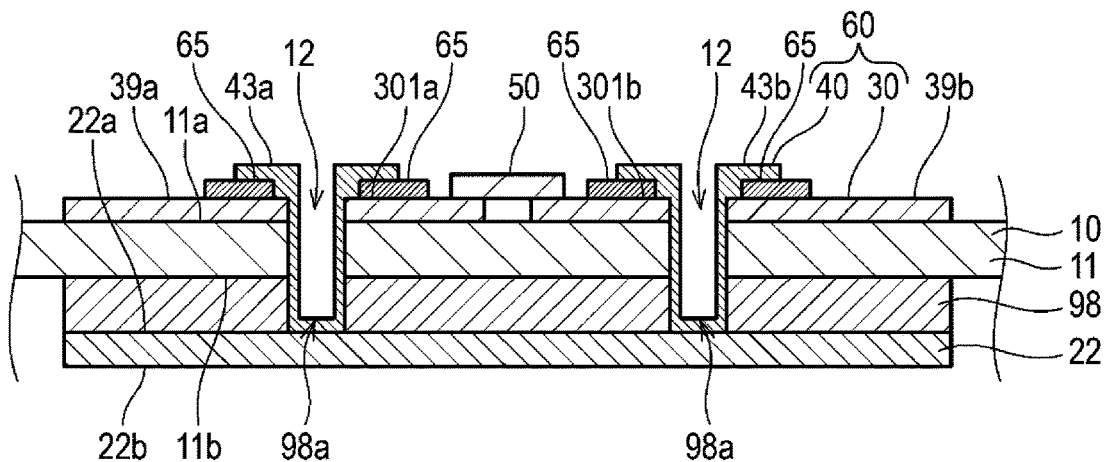

<u>100</u>

COMPONENT MOUNTING SUBSTRATE

TECHNICAL FIELD

The present invention relates to a component mount board.

BACKGROUND ART

Patent Literature 1 describes a component mount board (sensor of this document) including a board and a tuned radio frequency circuit supported on the board. The tuned radio frequency circuit has a first conductive pattern, a first capacitor, and a jumper all arranged on the same side of the board. The first capacitor includes a first capacitor plate, a second capacitor plate, and a first dielectric material arranged between the first capacitor plate and the second capacitor plate. The first dielectric material is soluble in liquid.

CITATION LIST

Patent Literature

Patent Literature 1: JP-T-2014-529732

SUMMARY OF INVENTION

Problems to be Solved by Invention

According to study conducted by the inventors of the present application, there is still room for improvement in the component mount board of Patent Literature 1 in terms of reliability in sensing a state of the component mount board being soaked in liquid.

The present invention has been made in view of the above-described problems. The present invention provides a component mount board having a structure capable of more reliably sensing a state of the component mount board being soaked in liquid.

Solution to Problems

Provided according to the present invention is a component mount board including:

a board including a base, a first conductive pattern formed on the base, and a mount component electrically connected to the first conductive pattern; and a second conductive pattern forming a circuit together with the first conductive pattern in a complementary manner, in which a portion of the base corresponding to the second conductive pattern is a missing portion where the base is missing, and the second conductive pattern is soluble in liquid, or is weakened when becoming wet with liquid.

Effects of Invention

According to the present invention, the state of the component mount board being soaked in liquid can be more reliably sensed.

BRIEF DESCRIPTION OF DRAWINGS

FIG. 1 is an end view of a component mount board according to a first embodiment;

FIG. 4 is a plan view of the component mount board according to the first embodiment, and selectively shows a board;

FIG. 5 is a plan view of a second board of the component mount board according to the first embodiment;

FIGS. 6(a), 6(b), and 6(c) are views describing a method for manufacturing the component mount board according to the first embodiment, and specifically show an example of steps performed for the board before assembly with the second board;

FIG. 9 is a plan view of the component mount board according to the second embodiment;

FIG. 16 is an end view of a component mount board according to a modification of the fourth embodiment;

FIG. 17 is an end view of a component mount board according to a fifth embodiment;

DESCRIPTION OF EMBODIMENTS

First Embodiment

Figure 1:
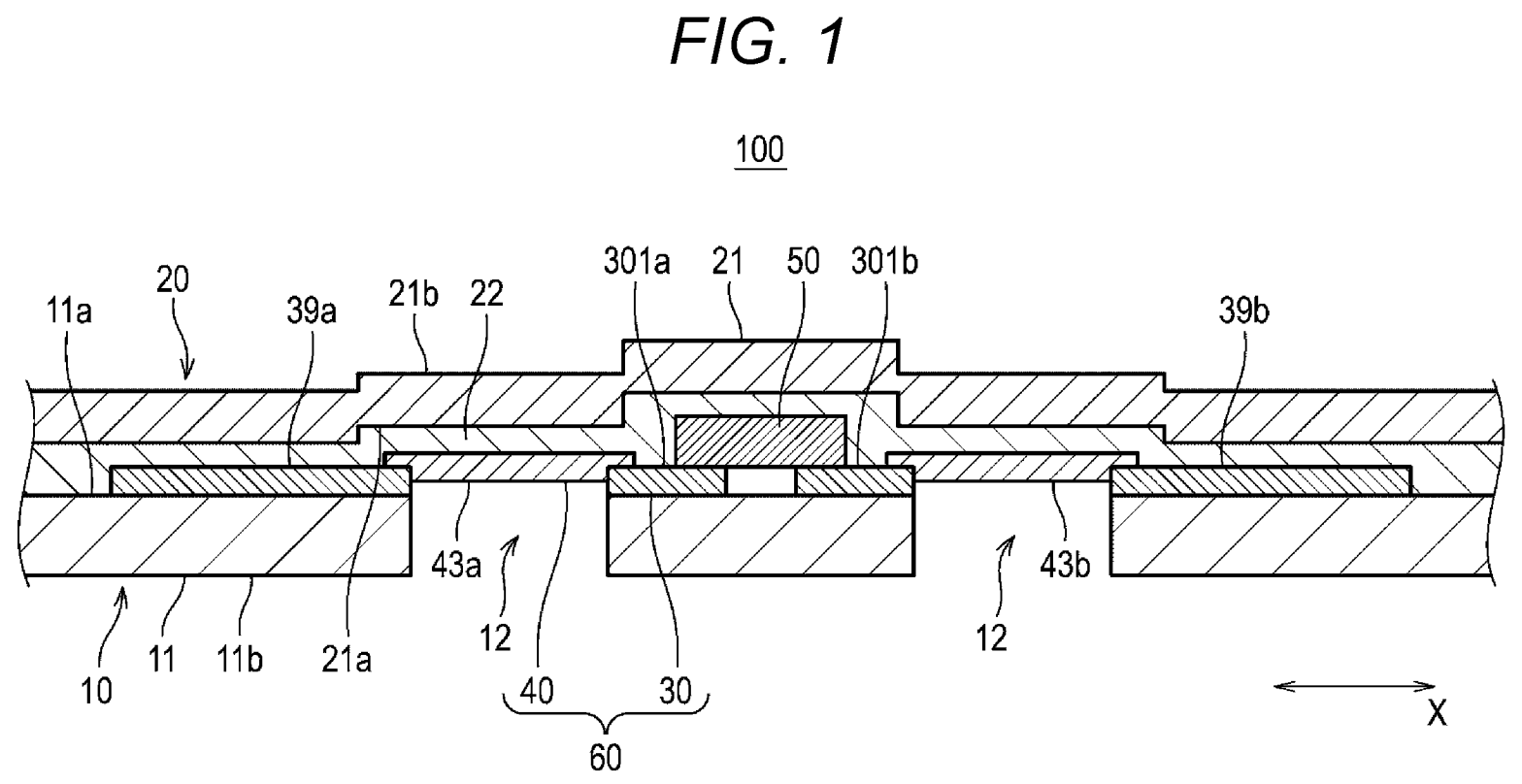

Hereinafter, a first embodiment of the present invention will be described using FIGS. 1 to 7(a). Note that in all the drawings, the same reference signs are used to represent similar components and description thereof will be omitted as necessary. FIG. 1 shows a cut end surface along a B-B line in a region A (region surrounded by a chain double-dashed line) shown in FIG. 3, and FIG. 2 is an exploded end view of a portion corresponding to that shown in FIG. 1.

Figure 2:
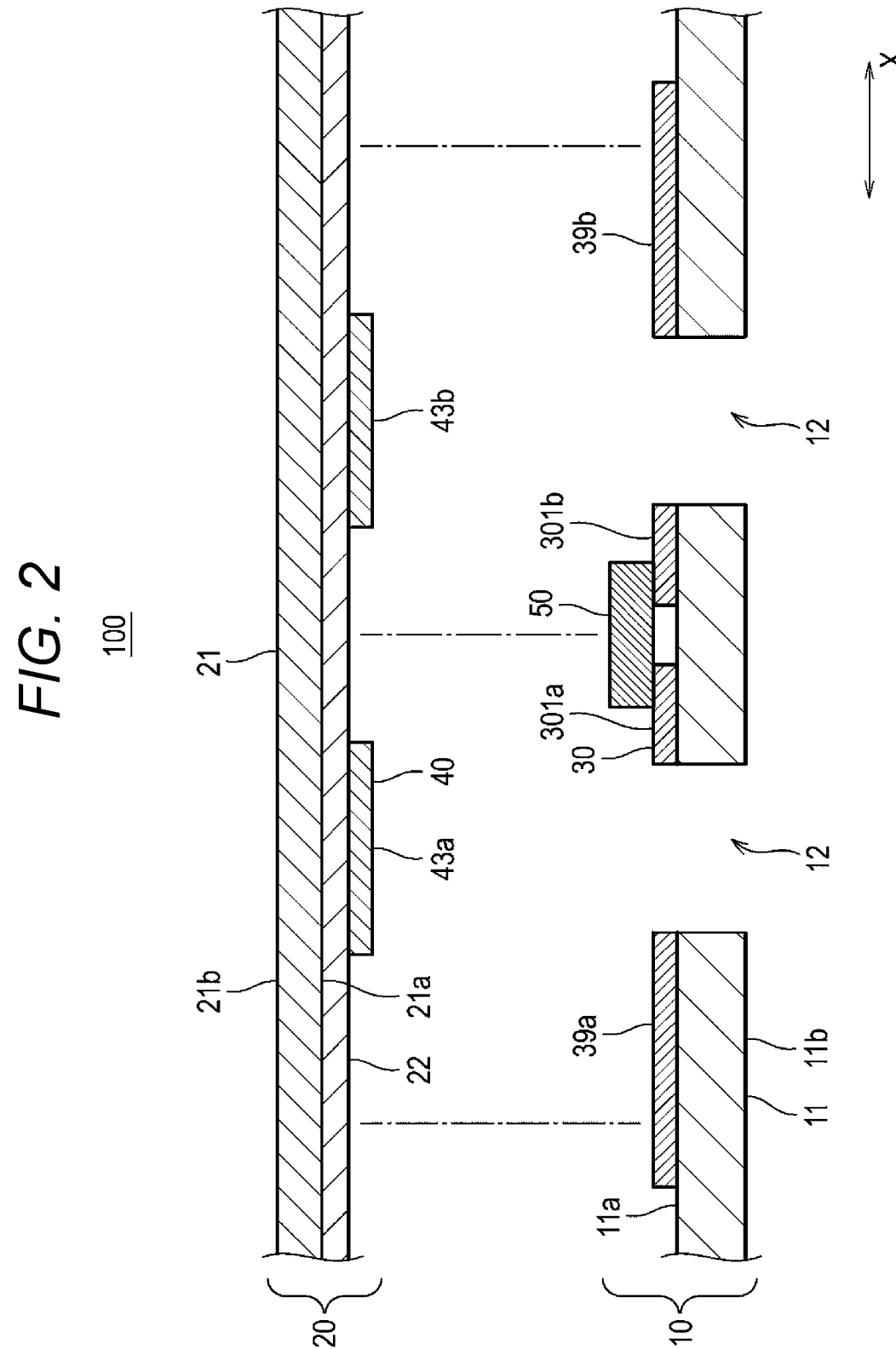
FIG. 2 is an exploded end view of the component mount board according to the first embodiment.
Figure 3:
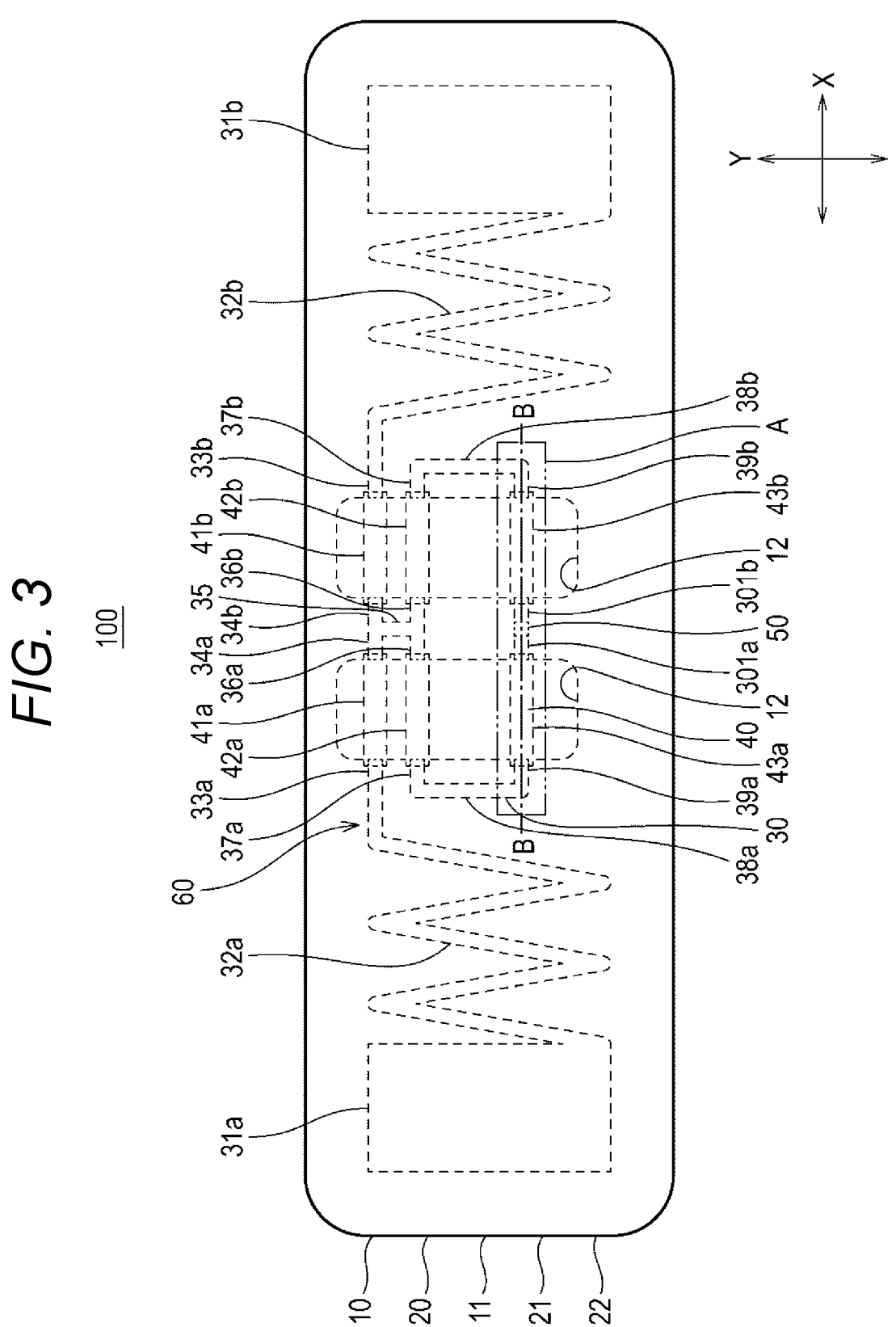
FIG. 3 is a plan view of the component mount board according to the first embodiment.

As shown in FIGS. 1 to 3, a component mount board 100 according to the present embodiment includes a board 10 having a base 11, a first conductive pattern 30 formed on the base 11, and a mount component 50 electrically connected to the first conductive pattern 30 and a second conductive pattern 40 forming a circuit 60 together with the first conductive pattern 30 in a complementary manner.

A portion of the base 11 corresponding to the second conductive pattern 40 is a missing portion 12 where the base 11 is missing. The second conductive pattern 40 is soluble in liquid, or is weakened when getting wet with liquid.

Here, the second conductive pattern 40 being soluble in liquid indicates that the second conductive pattern 40 is dissolved or weakened due to contact with liquid, and more specifically indicates that the second conductive pattern 40 is dissolved or weakened due to contact with water (moisture), for example. That is, the second conductive pattern 40 is, for example, soluble in water. Note that the second conductive pattern 40 may be soluble in liquid containing no moisture, such as an organic solvent.

The portion of the base 11 corresponding to the second conductive pattern 40 is a portion corresponding to (overlapping with) the second conductive pattern 40 in plan view (as viewed in a direction perpendicular to the plane of the component mount board 100).

The initial properties of the circuit 60 cannot be maintained by dissolving or weakening of the second conductive pattern 40 due to sufficient contact with liquid. A change in the properties (mainly impedance) of the circuit 60 is detected, and in this manner, a state of the component mount board 100 being soaked in liquid can be sensed.

According to the present embodiment, since the portion of the base 11 corresponding to the second conductive pattern 40 is the missing portion 12, liquid can easily contact the second conductive pattern 40 through the missing portion 12. Thus, when the component mount board 100 is soaked in liquid, the second conductive pattern 40 can be more reliably dissolved. That is, the state of the component mount board 100 being soaked in liquid can be more reliably sensed.

The component mount board 100 is, for example, a laminate formed in a flat plate shape. The planar shape of the component mount board 100 may be, but not specifically limited to, a substantially rectangular shape (e.g., rectangular shape with round corners) as shown in FIG. 3, as one example.

In the case of the present embodiment, the mount component 50 is, as one example, an RFID chip (generally also called an IC chip), and the component mount board 100 is an RFID tag.

Hereinafter, in description of, e.g., a positional relationship among the components of the component mount board 100, the upper side in FIG. 1 will be referred to as an upper side or above, and the opposite side thereof will be referred to as a lower side or below, for example. Moreover, a direction perpendicular to the up-down direction will be described as a horizontal direction, for example. However, these directions are defined for the sake of convenience, and are not intended to limit directions upon manufacturing or use of the component mount board 100.

The right-left direction in FIGS. 1 to 3 will be referred to as an X-direction, and the up-down direction in FIG. 3 will be referred to as a Y-direction. The X-direction and the Y-direction are directions (horizontal directions) parallel with the planar direction of the component mount board 100, and are perpendicular to the up-down direction (direction perpendicular to the plane of the component mount board 100) in FIG. 1.

In the case of the present embodiment, as shown in FIGS. 1 and 2, the component mount board 100 further includes a second base 21 arranged so as to face the base 11, and the second conductive pattern 40 is formed on the second base 21.

More specifically, the component mount board 100 includes, for example, a second board 20 in addition to the above-described board 10, and the second board 20 has the second base 21 and the second conductive pattern 40 formed on the second base 21.

According to such a configuration, since the component mount board 100 includes both the board 10 and the second board 20, both the structural strength of the component mount board 100 and reliability in sensing the state of the component mount board 100 being soaked in liquid can be favorably obtained.

The second base 21 is, for example, soluble in liquid. With this configuration, when slight external force is applied to the second conductive pattern 40 in a state in which the second base 21 holding the second conductive pattern 40 is dissolved due to sufficient contact with liquid, it can be expected that the second conductive pattern 40 is easily broken or cracked and the initial properties of the circuit 60 are no longer maintained. That is, the state of the component mount board 100 being soaked in liquid can be more reliably sensed.

Here, the second base 21 being soluble in liquid indicates that the second base 21 is dissolved due to contact with liquid. More specifically, liquid is liquid containing moisture, and being soluble indicates that the second base 21 is dissolved due to contact with water (moisture), for example. That is, the second base 21 is, for example, soluble in water. Note that the second base 21 may be soluble in liquid containing no moisture, such as an organic solvent.

The second base 21 contains polyvinyl alcohol (PVA), for example. Since the second base 21 contains PVA, a structure of the second base 21 being favorably dissolved when the component mount board 100 contacts moisture can be achieved.

Note that in a case where the second base 21 is soluble in water, the material of the second base 21 is not limited to PVA and may be, for example, a polyvinylpyrrolidone, water-soluble polyester, or water-soluble paper material or a sheet material derived from a starch component.

The thickness dimension of the second base 21 is, but not specifically limited to, preferably 5 µm or more and 100 µm or less, for example. Since the thickness dimension of the second base 21 is 5 µm or more, the second base 21 can stably support the second conductive pattern 40 at a stage before contact of the component mount board 100 with liquid. Since the thickness dimension of the second base 21 is 100 µm or less, the second base 21 can be quickly dissolved when the component mount board 100 contacts liquid. Note that in a case where the thickness dimension of the second base 21 is a relatively-thin dimension of, e.g., 5 µm, a release and a separator made of a paper or film material are preferably bonded to the second base 21 in the course of manufacturing the component mount board 100. With this configuration, the handleability of the thin second base 21 with, e.g., about 5 µm can be improved. The release and the separator as described above may be detached and removed after completion of the component mount board 100.

Figure 4:
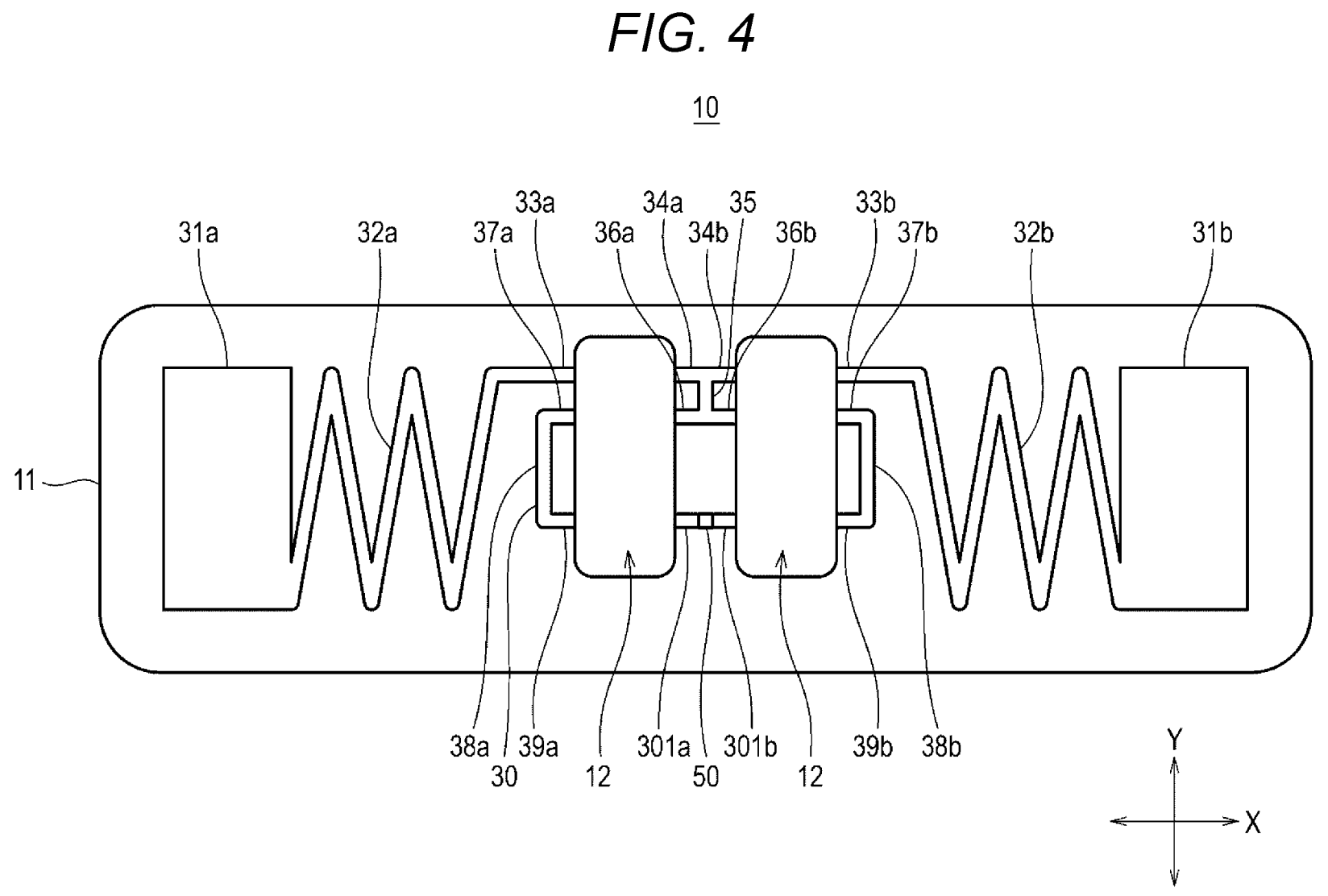

As shown in FIGS. 3 and 4, in the case of the present embodiment, the missing portion 12 is an opening formed in the base 11. That is, the missing portion 12 penetrates the base 11 from the front to the back thereof. In a region where the missing portion 12 is present, no first conductive pattern 30 is formed. The missing portion 12 may be in a slit shape.

More specifically, the board 10 has, for example, a pair of right and left missing portions 12, and the right and left missing portions 12 have the same shape and are arranged symmetrically in the right-left direction. More specifically, the missing portion 12 is formed in a substantially rectangular shape (e.g., rectangular shape with round corners) elongated in the Y-direction, for example. Note that the shape of the missing portion 12 is not specifically limited. Moreover, for example, a portion and another portion of the board 10 formed separately from each other may be assembled in such a positional relationship that the missing portion 12 is formed between these portions. In this case, the first conductive pattern 30 includes a combination of a portion formed by the portion of the board 10 and a portion formed by another portion of the board 10.

In the case of the present embodiment, the first conductive pattern 30 has, as one example, an antenna wiring portion and a component mount wiring portion described below.

The antenna wiring portion includes a first antenna wiring portion located on the left side in FIG. 4 and a second antenna wiring portion located on the right side. The first antenna wiring portion has, for example, a wide portion 31a formed in a substantially rectangular shape elongated in the Y-direction in plan view and a zigzag portion 32a formed thinner than the wide portion 31a and extending zigzag in the Y-direction while extending in the X-direction. The left end of the zigzag portion 32a is connected to the wide portion 31a, and the right end of the zigzag portion 32a is connected to the component mount wiring portion. The second antenna wiring portion is formed, for example, symmetrical to the first antenna wiring portion in the right-left direction, and has a wide portion 31b and a zigzag portion 32b. The right end of the zigzag portion 32b is connected to the wide portion 31b, and the left end of the zigzag portion 32b is connected to the component mount wiring portion.

The component mount wiring portion has a linear pattern forming portion 33a connected to the right end of the zigzag portion 32a and extending in the X-direction, a linear pattern forming portion 34a arranged on the extension of the linear pattern forming portion 33a with the left missing portion 12 interposed therebetween and extending in the X-direction, a linear pattern forming portion 34b connected to the right side of the linear pattern forming portion 34a and extending in the X-direction, and a linear pattern forming portion 33b arranged on the extension of the linear pattern forming portion 34b with the right missing portion 12 interposed therebetween and extending in the X-direction.

The component mount wiring portion further has a coupling portion 35 and annular pattern forming portions 36a, 37a, 38a, 39a, 301a, 36b, 37b, 38b, 39b, 301b as described below.

One end of the coupling portion 35 is connected to the boundary between the linear pattern forming portion 34a and the linear pattern forming portion 34b, and the coupling portion 35 extends to one side (below in FIG. 4) from such a boundary in the Y-direction (i.e., extends in the Y-direction).

The annular pattern forming portion 36a is connected to the other end of the coupling portion 35, and extends leftward from the other end of the coupling portion 35 (i.e., extends in the X-direction). The annular pattern forming portion 37a is arranged on the extension of the annular pattern forming portion 36a with the left missing portion 12 interposed therebetween, and extends in the X-direction. One end of the annular pattern forming portion 38a is connected to the left end of the annular pattern forming portion 37a, and the annular pattern forming portion 38a extends to one side (below in FIG. 4) from the left end of the annular pattern forming portion 37a in the Y-direction (i.e., extends in the Y-direction). The annular pattern forming portion 39a is connected to the other end of the annular pattern forming portion 38a, and extends rightward from the other end of the annular pattern forming portion 38a (i.e., extends in the X-direction). The annular pattern forming portion 301a is arranged on the extension of the annular pattern forming portion 39a with the left missing portion 12 interposed therebetween, and extends in the X-direction.

The annular pattern forming portion 36b is connected to the other end of the coupling portion 35, and extends rightward from the other end of the coupling portion 35 (i.e., extends in the X-direction). The annular pattern forming portion 37b is arranged on the extension of the annular pattern forming portion 36b with the right missing portion 12 interposed therebetween, and extends in the X-direction. One end of the annular pattern forming portion 38b is connected to the right end of the annular pattern forming portion 37b, and the annular pattern forming portion 38b extends to one side (below in FIG. 4) from the right end of the annular pattern forming portion 37b in the Y-direction (i.e., extends in the Y-direction). The annular pattern forming portion 39b is connected to the other end of the annular pattern forming portion 38b, and extends leftward from the other end of the annular pattern forming portion 38b (i.e., extends in the X-direction). The annular pattern forming portion 301b is arranged on the extension of the annular pattern forming portion 39b with the right missing portion 12 interposed therebetween, and extends in the X-direction.

The annular pattern forming portion 301a is arranged on the extension of the annular pattern forming portion 301b, and vice versa.

Figure 5:
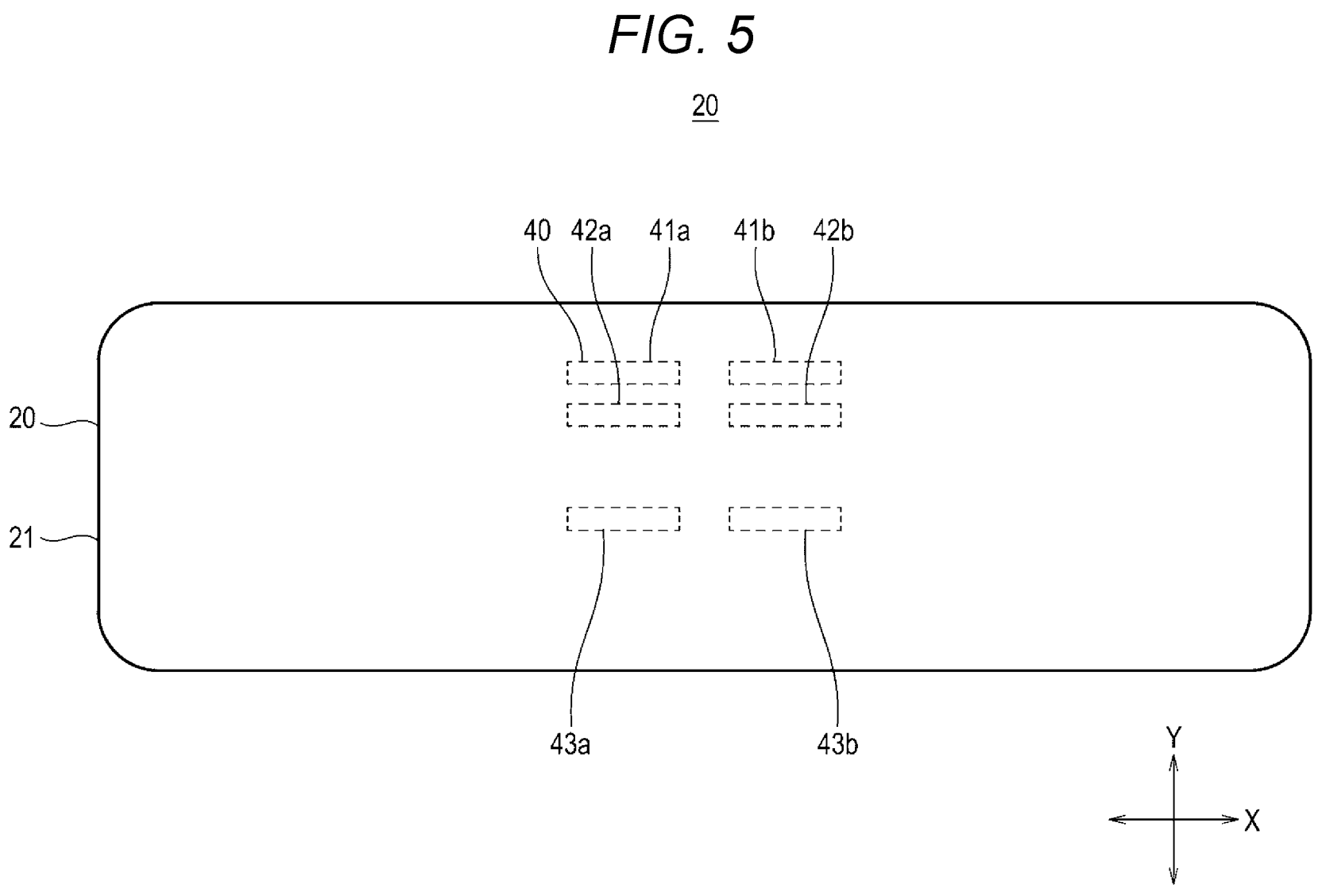

As shown in FIG. 5, the second board 20 has, as the second conductive pattern 40, bridge portions 41a, 41b, 42a, 42b, 43a, 43b extending in the X-direction, for example.

As shown in FIG. 3, the bridge portion 41a connects a right end portion of the linear pattern forming portion 33a and a left end portion of the linear pattern forming portion 34a to each other. The bridge portion 41b connects a right end portion of the linear pattern forming portion 34b and a left end portion of the linear pattern forming portion 33b to each other. With this configuration, the linear pattern forming portion 33a, the bridge portion 41a, the linear pattern forming portion 34a, the linear pattern forming portion 34b, the bridge portion 41b, and the linear pattern forming portion 33b form a linear pattern linearly extending in the X-direction and connecting the first antenna wiring portion and the second antenna wiring portion to each other.

The bridge portion 42a connects a right end portion of the annular pattern forming portion 37a and a left end portion of the annular pattern forming portion 36a to each other. The bridge portion 42b connects a right end portion of the annular pattern forming portion 36b and a left end portion of the annular pattern forming portion 37b to each other. The bridge portion 43a connects a right end portion of the annular pattern forming portion 39a and a left end portion of the annular pattern forming portion 301a to each other. The bridge portion 43b connects a right end portion of the annular pattern forming portion 301b and a left end portion of the annular pattern forming portion 39b to each other. With this configuration, the annular pattern forming portion 301a, the bridge portion 43a, the annular pattern forming portion 39a, the annular pattern forming portion 38a, the annular pattern forming portion 37a, the bridge portion 42a, the annular pattern forming portion 36a, the annular pattern forming portion 36b, the bridge portion 42b, the annular pattern forming portion 37b, the annular pattern forming portion 38b, the annular pattern forming portion 39b, the bridge portion 43b, and the annular pattern forming portion 301b form an annular pattern. The annular pattern is formed, for example, in a substantially rectangular annular shape in plan view. The annular pattern is non-continuous between the annular pattern forming portion 301a and the annular pattern forming portion 301b. That is, the annular pattern is in a shape (opened annular shape) having an opening.

The coupling portion 35 couples the linear pattern and the annular pattern to each other.

Here, each of the bridge portion 41a, the bridge portion 42a, and the bridge portion 43a is arranged over the left missing portion 12, and each of the bridge portion 41b, the bridge portion 42b, and the bridge portion 43b is arranged over the right missing portion 12.

As shown in FIG. 1, the bridge portion 43a is bridged between the annular pattern forming portion 39a and the annular pattern forming portion 301a to electrically connect the annular pattern forming portion 39a and the annular pattern forming portion 301a to each other. Similarly, the bridge portion 43b is bridged between the annular pattern forming portion 301b and the annular pattern forming portion 39b to electrically connect the annular pattern forming portion 301b and the annular pattern forming portion 39b to each other.

Similarly, the bridge portion 41a is bridged between the linear pattern forming portion 33a and the linear pattern forming portion 34a to electrically connect the linear pattern forming portion 33a and the linear pattern forming portion 34a to each other. The bridge portion 41b is bridged between the linear pattern forming portion 34b and the linear pattern forming portion 33b to electrically connect the linear pattern forming portion 34b and the linear pattern forming portion 33b to each other. The bridge portion 42a is bridged between the annular pattern forming portion 37a and the annular pattern forming portion 36a to electrically connect the annular pattern forming portion 37a and the annular pattern forming portion 36a to each other. The bridge portion 42b is bridged between the annular pattern forming portion 36b and the annular pattern forming portion 37b to electrically connect the annular pattern forming portion 36b and the annular pattern forming portion 37b to each other.

As described above, the second conductive pattern 40 (each of the bridge portions 41a, 41b, 42a, 42b, 43a, 43b) is arranged over the missing portion 12, and is bridged between a first portion of the first conductive pattern 30 and a second portion of the first conductive pattern 30 separated from the first portion through the missing portion 12 to electrically connect the first portion and the second portion to each other. That is, each second conductive pattern 40 is a bridge wiring. The second conductive pattern 40 extends, in plan view, across the missing portion 12 from part of a peripheral edge portion of the missing portion 12 to another portion of the peripheral edge portion of the missing portion 12.

Note that the second board 20 may have, as the second conductive pattern 40, a portion other than the above-described bridge portions 41a to 43b and the bridge portions 41a to 43b are wiring portions forming the circuit 60.

That is, a portion (bridge portions 41a to 43b) of the second conductive pattern 40 corresponding to the missing portion 12 is a wiring portion forming the circuit 60, and is not, e.g., an electrode.

The second conductive pattern 40 (each of the bridge portions 41a, 41b, 42a, 42b, 43a, 43b) is preferably formed thicker than a portion (linear pattern forming portions 33a, 33b, 34a, 34b, annular pattern forming portions 36a, 36b, 37a, 37b, 39a, 39b, 301a, 301b) of the first conductive pattern 30 connected to the second conductive pattern 40. With this configuration, when the board 10 and the second board 20 are assembled and aligned with each other and the second conductive pattern 40 and the first conductive pattern 30 are electrically connected to each other, to address the situation where the board 10 and the second board 20 are slightly relatively misaligned in the planar direction, the second conductive pattern 40 can be connected to the first conductive pattern 30 in proper alignment with the first conductive pattern 30. Note that in a case where the first conductive pattern 30 is, for example, a pattern derived from metal foil and the impedance thereof is low, as a result of forming the second conductive pattern 40 as a coating film by printing, the impedance of the second conductive pattern 40 is expected to be a higher value than the impedance of the above-described pattern made of metal foil. However, the second conductive pattern 40 is formed thicker than the portion of the first conductive pattern 30 connected to the second conductive pattern 40 as described above, and it is advantageous because impedance matching between the first conductive pattern 30 and the second conductive pattern 40 can be made in a low impedance state.

Note that the second conductive pattern 40 may be formed with the same width as that of the portion of the first conductive pattern 30 connected to the second conductive pattern 40 or be formed thinner than such a portion.

The length of the second conductive pattern 40 is preferably longer than the width dimension of the portion (linear pattern forming portions 33a, 33b, 34a, 34b, annular pattern forming portions 36a, 36b, 37a, 37b, 39a, 39b, 301a, 301b) of the first conductive pattern 30 connected to the second conductive pattern 40, more preferably a length twice as long as the width dimension or more, and much more preferably a length three times as long as the width dimension or more.

Specifically, the length (bridge length) of a portion of the second conductive pattern 40 bridged over the first conductive pattern 30 (between the first portion and the second portion) is preferably longer than the width dimension of the portion of the first conductive pattern 30 connected to the second conductive pattern 40, more preferably a length twice as long as the width dimension or more, and much more preferably a length three times as long as the width dimension or more.

In the case of the present embodiment, not only the second base 21 is soluble in liquid, but also the second conductive pattern 40 is soluble in liquid or is weakened due to contact with liquid as described above.

Here, the second conductive pattern 40 being soluble in liquid indicates that the second conductive pattern 40 is dissolved or weakened (not fully dissolved, but altered to such an extent that the second conductive pattern 40 is easily disconnected) due to contact with liquid as described above, and more specifically, indicates that the second conductive pattern 40 is dissolved or weakened due to contact with water (moisture), for example. These properties of the second conductive pattern 40 with which the second conductive pattern 40 is dissolved or weakened due to contact with water indicate that "the second conductive pattern 40 is soluble in water." Note that the second conductive pattern 40 may be soluble or weakened in liquid containing no moisture, such as an organic solvent. More specifically, the second conductive pattern 40 and the second base 21 have properties of being soluble or weakened in the same type of liquid (e.g., water).

In the case of the present embodiment, the second conductive pattern 40 contains resin having hot melt properties. The second conductive pattern 40 is hot-melt joined to the first conductive pattern 30, and accordingly, is electrically and mechanically connected to the first conductive pattern 30. That is, the second conductive pattern 40 is fusion-joined to the first conductive pattern 30, and the second conductive pattern 40 and the first conductive pattern 30 do not merely contact each other.

The second conductive pattern 40 is, for example, a coating film containing a conductive filler and a binder containing thermoplastic resin. As the thermoplastic resin, one exhibiting hot melt properties at 50° C. or more is preferable.

The second conductive pattern 40 is made, for example, of water-soluble conductive paste, and as one example, is a water-soluble silver pattern.

More specifically, the second conductive pattern 40 is made, for example, of a dry material obtained in such a manner that conductive particles (e.g., silver particles) are knead, using an organic solvent, with thermoplastic resin.

The thickness dimension of the second conductive pattern 40 is, but not specifically limited to, preferably 10 μm or more and 50 μm or less, for example. Since the thickness dimension of the second conductive pattern 40 is 10 μm or more, the stable properties of the circuit 60 can be obtained at a stage before contact of the component mount board 100 with liquid. Since the thickness dimension of the second conductive pattern 40 is 50 μm or less, the second conductive pattern 40 can be quickly dissolved or weakened when the component mount board 100 contacts liquid.

In the case of the present embodiment, since the second conductive patterns 40 as the bridge wirings are arranged at multiple locations on the circuit 60, a probability of any of the second conductive patterns 40 being broken, cracked, or dissolved or weakened upon contact of the component mount board 100 with liquid can be increased.

In the case of the present embodiment, the base 11 is not soluble in liquid. Thus, even when the component mount board 100 accidentally contacts liquid upon, e.g., storage, a probability of the properties of the circuit 60 being changed due to breakage or cracking of the first conductive pattern 30 by dissolving of the base 11 can be reduced.

The base 11 insoluble in liquid may be made of paper or a resin film, for example. Examples of a resin material forming the resin film may include, but not specifically limited to, polyethylene, polystyrene, polypropylene, and polyester.

Note that the present invention is not limited to this example and the base 11 may be soluble in liquid.

The thickness dimension of the base 11 is, but not specifically limited to, preferably 10 μm or more and 75 μm or less. Since the thickness dimension of the base 11 is 10 μm or more, the base 11 can stably support the first conductive pattern 30 and the structural strength of the component mount board 100 can be sufficiently obtained.

Since the thickness dimension of the base 11 is 75 μm or less, favorable flexibility of the component mount board 100 is obtained.

In the case of the present embodiment, the first conductive pattern 30 is also not soluble in liquid. Thus, a probability of the properties of the circuit 60 being changed due to dissolving of the first conductive pattern 30 even when the component mount board 100 accidentally contacts liquid upon, e.g., storage can be reduced. Specifically, over the half of the circuit 60 is preferably formed by the first conductive pattern 30 insoluble in liquid.

Note that the present invention is not limited to this example and the first conductive pattern 30 may be soluble in liquid.

The first conductive pattern 30 is, for example, made of metal foil. More specifically, the first conductive pattern 30 is formed of metal foil pattern-formed by etching. Examples of the metal material may include aluminum, gold, silver, and copper.

Note that the first conductive pattern 30 may be a printed coating film, for example.

In a case where the first conductive pattern 30 is formed by printing, the first conductive pattern 30 is, for example, a coating film containing a conductive filler and a binder containing thermoplastic resin. The conductive filler is made of, for example, gold, silver, copper, and carbon. Examples of the thermoplastic resin may include polyester resin, acrylic resin, and urethane resin.

The thickness dimension of the first conductive pattern 30 is, but not specifically limited to, preferably 5 μm or more and 30 μm or less, for example.

As shown in FIGS. 1 and 2, in the case of the present embodiment, a soluble layer 22 which is an adhesive layer soluble in liquid is formed on the surface (one surface 21*a*) of the second base 21 facing the base 11, and the second conductive pattern 40 is formed on the second base 21 through the soluble layer 22.

Thus, when the soluble layer 22 is dissolved due to sufficient contact with liquid, the second base 21 also contacts the liquid.

Here, the soluble layer 22 being soluble in liquid indicates that the soluble layer 22 is dissolved due to contact with liquid, and more specifically, indicates that the soluble layer 22 is dissolved due to contact with water (moisture), for example. That is, the soluble layer 22 is, for example, soluble in water. Note that the soluble layer 22 may be soluble in liquid containing no moisture, such as an organic solvent. More specifically, the soluble layer 22 and the second base 21 are soluble in the same type of liquid (e.g., water).

Examples of an adhesive forming the soluble layer 22 that is water-soluble (or aqueous) may include, but not specifically limited to, starch paste, acacia paste, and aqueous acrylic emulsion. As an example, the aqueous acrylic emulsion is formed in such a manner that acrylic monomer containing a carboxyl group is copolymerized and alcohol and polyethylene oxide are added thereto. The soluble layer 22 may contain two or more types of water-soluble (or aqueous) adhesives.

Not only the soluble layer 22 bonds the second base 21 and the second conductive pattern 40 to each other, but also bonds the second base 21 and the base 11 to each other and bonds the second base 21 and the first conductive pattern 30 to each other.

The thickness dimension of the soluble layer 22 is, but not specifically limited to, preferably 5 μm or more and 50 μm or less and more preferably 10 μm or more and 30 μm or less.

Since the thickness dimension of the soluble layer 22 is 10 μm or more, the state of bonding between the second base 21 and the second conductive pattern 40, the state of bonding between the second base 21 and the base 11, and the state of bonding between the second base 21 and the first conductive pattern 30 can be favorably brought at a stage before contact of the soluble layer 22 with liquid.

Since the thickness dimension of the soluble layer 22 is 30 μm or less, the soluble layer 22 can be quickly dissolved when contacting liquid.

Note that the outer shape of the board 10 (base 11) and the outer shape of the second board 20 (second base 21) may be the same as each other or be different from each other. For example, in the case of the present embodiment, the outer shape of the board 10 (base 11) and the outer shape of the second board 20 (second base 21) are the same as each other, and are coincident with each other in plan view.

Moreover, the outer shape of the second board 20 (second base 21) and the outer shape of the soluble layer 22 may be the same as each other or be different from each other. For example, in the case of the present embodiment, the outer shape of the second board 20 (second base 21) and the outer shape of the soluble layer 22 are the same as each other, and are coincident with each other in plan view.

Although not shown in detail, the mount component 50 includes, for example, a component body having an element inside by resin molding and a mount terminal provided along the lower surface of the component body. The element and the mount terminal are electrically connected to each other in the resin-molded body. The number of mount terminals included in the mount component 50 is not specifically limited. In the case of the present embodiment, the mount component 50 includes two mount terminals, and each mount terminal is electrically connected to the first conductive pattern 30. More specifically, one mount terminal of the mount component 50 is electrically connected to a right end portion of the annular pattern forming portion 301*a*, and the other mount terminal of the mount component 50 is electrically connected to a left end portion of the annular pattern forming portion 301*b*. That is, the mount component 50 is arranged over the annular pattern forming portion 301*a* and the annular pattern forming portion 301*b*.

As described above, the mount component 50 is mounted on the component mount wiring portion.

The antenna wiring portion exchanges a signal with not-shown external equipment (e.g., RFID reader/writer), for example. A signal or radio wave received from the external equipment by the antenna wiring portion is input to the mount component 50. The mount component 50 transmits a signal to the external equipment via the component mount wiring portion and the antenna wiring portion. Note that in some cases, part or the entirety of the component mount wiring portion may function as an antenna in cooperation with the antenna wiring portion.

The mount component 50 is, for example, of a passive type to be operated with power excited from the external equipment via the antenna wiring portion.

In the case of the present embodiment, the communication function of the component mount board 100 is eliminated or degraded by dissolving, breakage, or cracking of the second conductive pattern 40 due to contact of the component mount board 100 with liquid. Elimination or degradation of the communication function is detected by the external equipment so that contact of the component mount board 100 with liquid can be sensed.

Next, a method for manufacturing the component mount board according to the present embodiment will be described using FIGS. 6(*a*) to 6(*c*).

FIG. 6(*a*) is a plan view showing the board 10 before formation of the missing portions 12. FIGS. 6(*b*) and 6(*c*) are views showing a step of forming the missing portions 12 in the board 10, and show a cut end surface along a B-B line in a region A (region surrounded by a chain double-dashed line) shown in FIG. 6(*a*).

The method for manufacturing the component mount board according to the present embodiment includes a step of preparing the board 10, a step of preparing the second board 20, and a step of assembling the board 10 and the second board 20 to each other.

In the step of preparing the board 10, the board 10 having the base 11, the first conductive pattern 30 formed on the base 11, and the mount component 50 electrically connected to the first conductive pattern 30 is prepared as shown in FIG. 6(*c*).

In the step of preparing the second board 20, the second board 20 (see FIG. 2) having the second base 21 soluble in liquid and the second conductive pattern 40 formed on the second base 21 is prepared.

In the step of assembling the board 10 and the second board 20 to each other, the board 10 and the second board 20 are assembled to each other such that the first conductive pattern 30 and the second conductive pattern 40 form the circuit 60 in a complementary manner and the portion of the base 11 corresponding to the second conductive pattern 40 forms the missing portion 12 where the base 11 is missing. That is, the board 10 and the second board 20 are aligned with facing each other, and then, are bonded to each other.

In this manner, the component mount board 100 according to the present embodiment is obtained.

The board 10 and the second board 20 can be bonded in such a manner that the board 10 and the second board 20 are thermocompressed (thermally laminated) to each other. As one example, a step of thermocompressing the board 10 and the second board 20 to each other is performed preferably at 80° C. or more and 150° C. or less and more preferably 100° C. or more and 120° C. or less. A heating time may be, for example, about 5 to 10 seconds. Moreover, the thermocompressing step is preferably performed under a pressurization condition of 0.3 MPa or more and 3.0 MPa or less and more preferably a pressurization condition of 1.0 MPa or more and 2.0 MPa or less.

The board 10 and the second board 20 are bonded as described above so that the second conductive pattern 40 containing the resin having the hot melt properties can be favorably electrically and mechanically connected to the first conductive pattern 30.

More specifically, a step of punching part of the board 10 as shown in FIG. 6(*b*) to form the missing portions 12 in the base 11 and divide the first conductive pattern 30 into multiple portions as shown in FIG. 6(*c*) is performed. Thereafter, the step (assembling step) of assembling the board 10 and the second board 20 to each other is performed.

By punching, the board 10 having the missing portions 12 and the first conductive pattern 30 divided into the multiple portions can be obtained. Thus, e.g., an existing RFID tag can be used as the board 10, and the component mount board 100 can be manufactured at a lower cost.

A punching direction is preferably a direction from the surface side (one surface 11*a* side of the base 11) of the board 10 facing the second board 20 to the opposite surface side (other surface 11*b* side of the base 11). That is, as shown in FIG. 6(*b*), cutting blades 110 are moved in the direction of arrows in FIG. 6(*b*), thereby punching the board 10. In this manner, the board 10 is machined into a shape shown in FIG. 6(*c*).

Thus, even when burrs are caused at the cut end surface of the first conductive pattern 30, these burrs are in a shape standing not toward the second board 20 side (i.e., second conductive pattern 40 side) but toward the opposite side thereof. Consequently, the second conductive pattern 40 can easily closely contact the first conductive pattern 30, and a favorable state of conduction from the second conductive pattern 40 to the first conductive pattern 30 can be brought.

Note that the cutting blade 110 is formed in an annular shape corresponding to the missing portion 12 in plan view.

Figure 7:
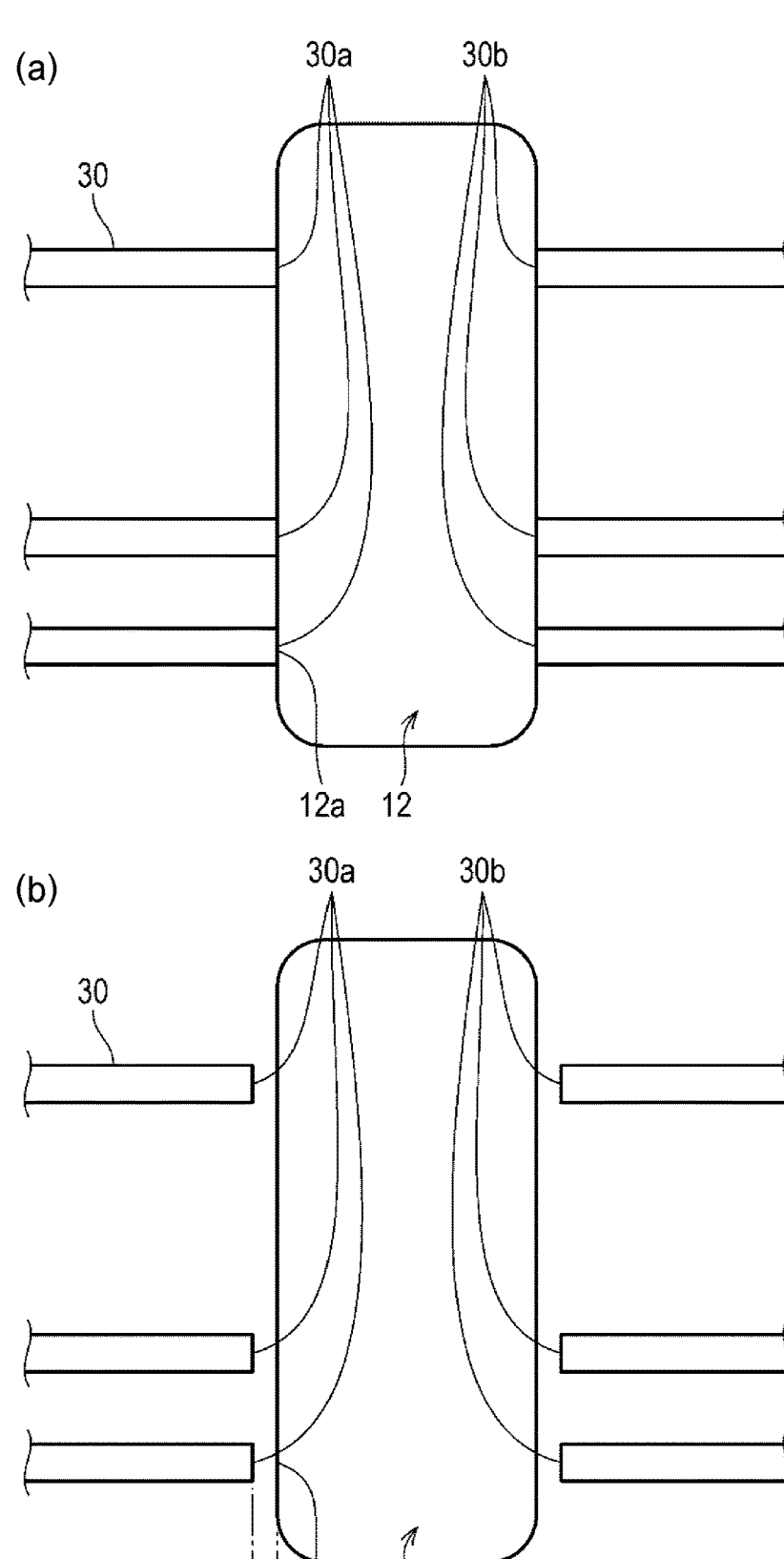
FIG. 7(a) is an enlarged plan view showing a missing portion and a peripheral edge portion thereof in the board of the component mount board according to the first embodiment.
FIG. 7(b) is an enlarged plan view showing a missing portion and a peripheral edge portion thereof in a board of a component mount board according to a first modification.

In the case of the present embodiment, the locations of ends 30*a*, 30*b* of the first conductive patterns 30 and the locations of ends 12*a* of the missing portion 12 are coincident with each other as shown in FIG. 7(*a*).

Since the missing portion 12 is formed in the board 10 by punching of part of the board 10 as described above, a structure in which the locations of the ends 30*a*, 30*b* of the first conductive patterns 30 and the locations of the ends 12*a* of the missing portion 12 are coincident with each other can be easily achieved.

In a case where part of the board 10 is punched, shoulder portions (in FIGS. 1 and 2, upper right corner portion of the annular pattern forming portion 39*a* and upper left corner portion of the annular pattern forming portion 39*b*) of the ends of the first conductive patterns 30 are in a round shape. Therefore, when the bridge portions 41*a* to 43*b* are laminated thereon, cutting and damage of the bridge portions 41*a* to 43*b* can be reduced.

Note that only one (e.g., only the end 30*a*) of the ends 30*a*, 30*b* of the first conductive patterns 30 connected to each other through the second conductive pattern 40 may be coincident with the end 12*a* of the missing portion 12 and the opposite side (e.g., end 30*b*) thereof may be apart from the end 12*a*.

In the present invention, as shown in FIG. 7(*b*), both the ends 30*a*, 30*b* of the first conductive patterns 30 may be apart from the ends 12*a* of the missing portion 12. That is, the ends 30*a*, 30*b* of the first conductive patterns 30 close to the missing portion 12 may be apart from the ends 12*a* of the missing portion 12.

In this case, a distance D (FIG. 7(*b*)) from the end 12*a* of the missing portion 12 to the end 30*a*, 30*b* is preferably 0.1 mm or more and also preferably 0.2 mm or more.

The first conductive patterns 30 in this case can be formed in such a manner that patterns are formed on the base 11 with the ends 30*a*, 30*b* arranged apart from the ends 12*a*. In this case, no burrs (burrs due to punching) are caused at the ends 30*a*, 30*b*, and therefore, cutting and damage of the bridge portions 41*a* to 43*b* can be reduced when the bridge portions 41*a* to 43*b* are laminated on the first conductive patterns 30.

Note that it has been described above that the missing portion 12 is formed by punching, but a technique of mainly applying a blade or a punch is a representative method. However, e.g., laser machining is also applicable as another technique of forming the missing portion 12.

Second Embodiment

Next, a second embodiment will be described using FIGS. 8(*a*) to 9.

A component mount board 100 according to the present embodiment is different from the component mount board 100 according to the first embodiment described above on the following points, and is configured similarly to the component mount board 100 according to the first embodiment described above on the other points.

Figure 8:
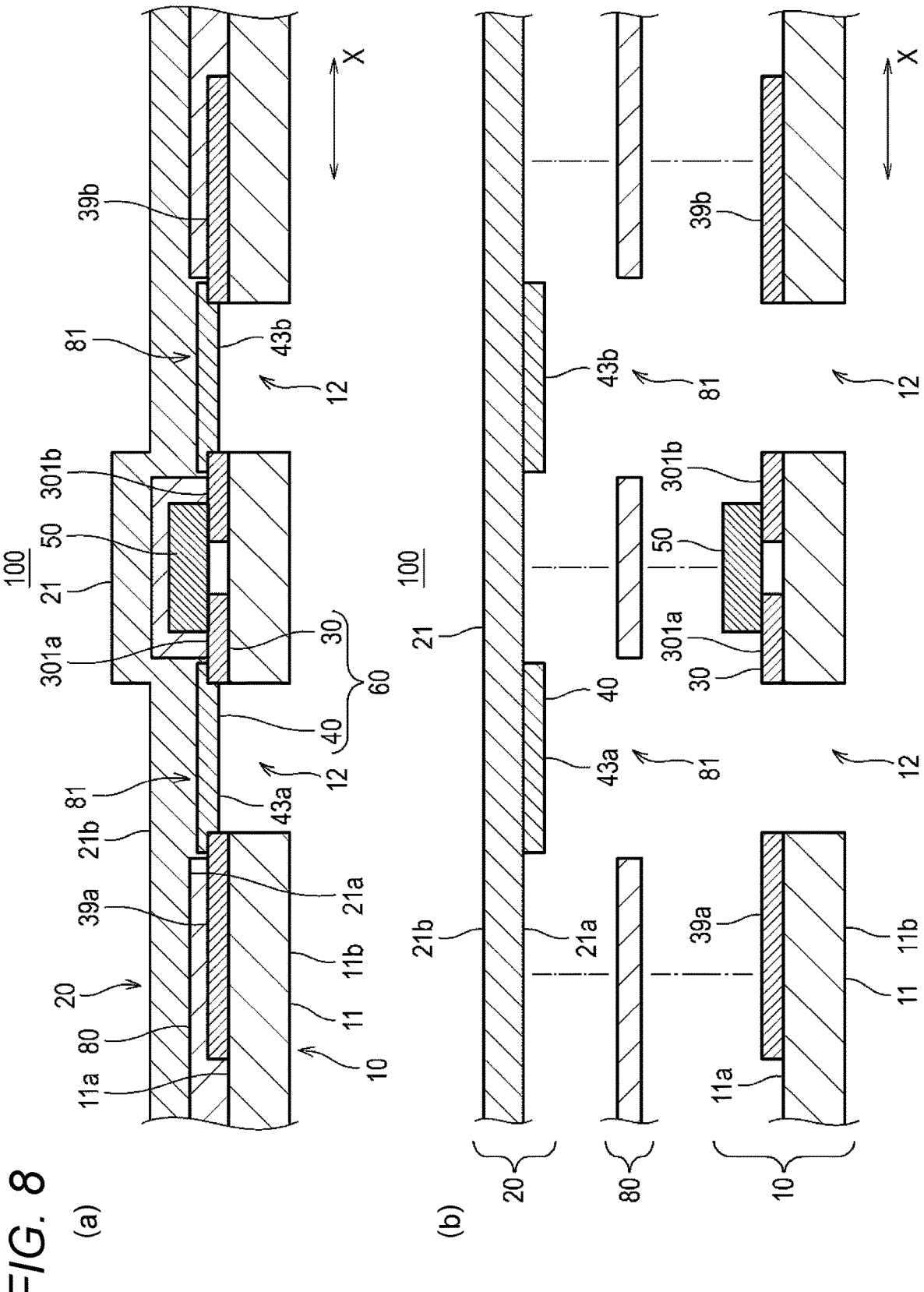
FIG. 8(a) is an end view of a component mount board according to a second embodiment.
FIG. 8(b) is an exploded end view of the component mount board according to the second embodiment.

In the case of the present embodiment, the component mount board 100 includes a joining sheet 80 shown in FIG. 8(*a*) etc. instead of the soluble layer 22 (see FIG. 1 etc.). The joining sheet 80 is an adhesive sheet having adherence properties or a bonding sheet having bonding properties. The joining sheet 80 is not soluble in liquid. Note that the joining sheet 80 may be soluble in liquid.

As shown in FIGS. 8(*a*) and 8(*b*), in the case of the present embodiment, the second conductive pattern 40 is directly formed on the second base 21. The board 10 and the second board 20 are bonded to each other through the joining sheet 80 (adhesive sheet or bonding sheet). As shown in FIG. 8(*a*), a region of the second base 21 including a region where the second conductive pattern 40 is formed faces the missing portion 12 through a second missing portion 81 formed in the joining sheet 80 (adhesive sheet or bonding sheet).

As described above, e.g., both end portions of the second conductive pattern 40 project from the missing portion 12 in plan view. Therefore, the "region of the second base 21 including the region where the second conductive pattern 40 is formed" is more specifically a region including a region where a portion of the second conductive pattern 40 other than both end portions thereof is formed, for example.

In the case of the present embodiment, since the second conductive pattern 40 is directly formed not on the soluble layer 22 but on the second base 21, the second conductive pattern 40 can be easily formed even by normal screen printing.

As shown in FIGS. 8(*a*) to 9, the second missing portion 81 includes the entire area of the missing portion 12 in plan view, for example. In plan view, the joining sheet 80 is interposed between the board 10 and the second board 20 in a region other than the missing portions 12 and a connection portion between the first conductive pattern 30 and the second conductive pattern 40.

For example, the joining sheet 80 has a left second missing portion 81 including the left missing portion 12 and a right second missing portion 81 including the right missing portion 12. The left second missing portion 81, for example, collectively and fully includes a region where the multiple second conductive patterns 40 (bridge portions 41*a*, 42*a*, 43*a*) corresponding to the left missing portion 12 are formed. The right second missing portion 81, for example, collectively and fully includes a region where the multiple second conductive patterns 40 (bridge portions 41*b*, 42*b*, 43*b*) corresponding to the right missing portion 12 are formed.

Note that one second missing portions 81 may include multiple (e.g., two) missing portions 12 and may collectively and fully include a region where all the second conductive patterns 40 are formed.

An end portion of the second conductive pattern 40 may overlap with the joining sheet 80 to such an extent that connection between the first conductive pattern 30 and the second conductive pattern 40 is not interfered.

Figure 9:
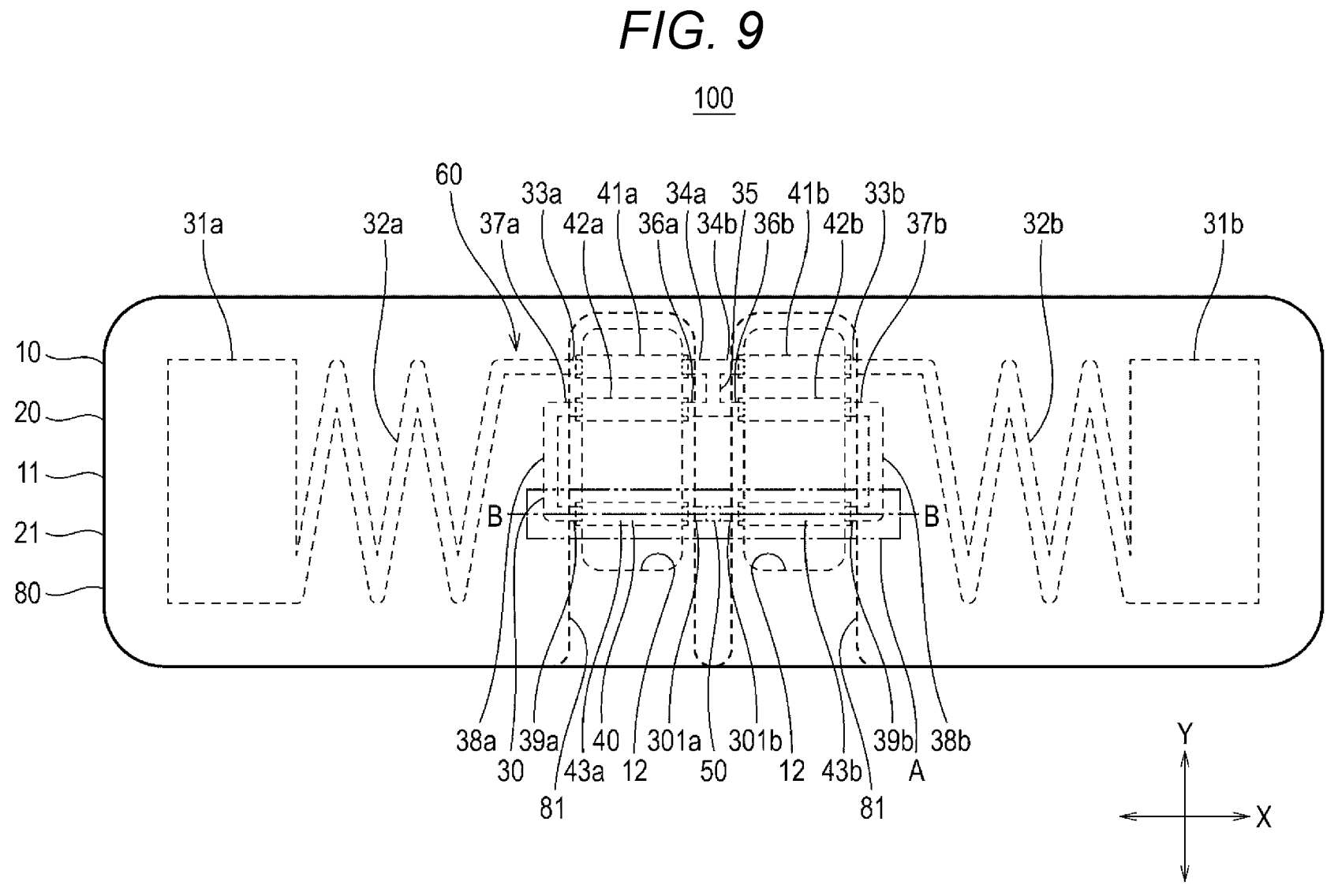

In the example of FIG. 9, the second missing portion 81 is a cutout-shaped portion formed in the joining sheet 80. Note that the second missing portion 81 may be an opening formed in the joining sheet 80. Alternatively, the component mount board 100 may have multiple joining sheets 80 independent of each other, and a clearance between these joining sheets 80 may be the second missing portion 81.

Note that the outer shape of the board 10 (base 11) and the outer shape of the joining sheet 80 (excluding the second missing portions 81) may be the same as each other or be different from each other.

Similarly, the outer shape of the second board 20 (second base 21) and the outer shape of the joining sheet 80 (excluding the second missing portions 81) may be the same as each other or be different from each other.

In the case of the present embodiment, the outer shapes of the board 10 (base 11), the second board 20 (second base 21), and the joining sheet 80 (excluding the second missing portions 81) are the same as each other and are coincident with each other in plan view, for example.

Third Embodiment

Next, a third embodiment will be described using FIGS. 10(*a*) to 11.

A component mount board 100 according to the present embodiment is different from the component mount board 100 according to the first embodiment described above on the following points, and is configured similarly to the component mount board 100 according to the first embodiment described above on the other points.

Figure 10:
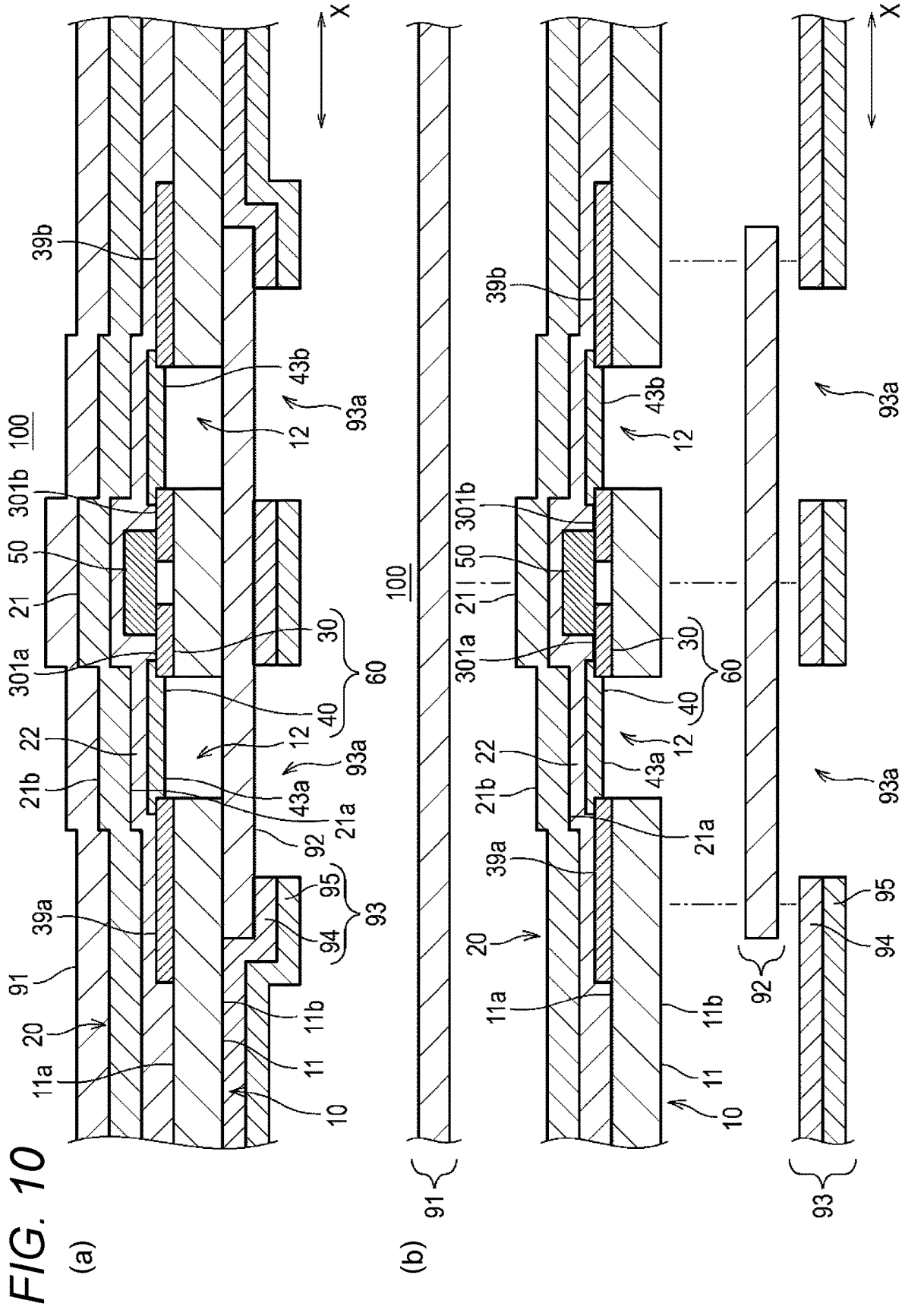
FIG. 10(a) is an end view of a component mount board according to a third embodiment.
FIG. 10(b) is an exploded end view of the component mount board according to the third embodiment.

As shown in FIGS. 10(*a*) and 10(*b*), the component mount board 100 according to the present embodiment includes a first non-woven fabric layer 92 arranged along the surface (other surface 11*b* of the base 11) of the board 10 opposite to the second board 20 side and a second non-woven fabric layer 91 arranged along the surface (other surface 21*b* of the second base 21) of the second board 20 opposite to the board 10 side. Note that the present invention is not limited to this example and the component mount board 100 may include only one of the first non-woven fabric layer 92 or the second non-woven fabric layer 91. That is, the component mount board 100 includes at least one of the first non-woven fabric layer 92 or the second non-woven fabric layer 91.

Since the component mount board 100 includes at least one of the first non-woven fabric layer 92 or the second non-woven fabric layer 91, the first non-woven fabric layer 92 or the second non-woven fabric layer 91 can absorb and hold liquid (e.g., water). Therefore, the liquid can be sufficiently supplied to the second base 21, the second conductive pattern 40, and the soluble layer 22. In addition, seepage of the second base 21, second conductive pattern 40, and soluble layer 22 dissolved in the liquid can be reduced by the first non-woven fabric layer 92 or the second non-woven fabric layer 91, and therefore, a user's uncomfortable feeling can be reduced.

Specifically, the first non-woven fabric layer 92 and the second non-woven fabric layer 91 are more preferably those (having a small basis weight) having high water absorption properties (high water retention properties).

The first non-woven fabric layer 92 or the second non-woven fabric layer 91 is preferably arranged at least in a region including the missing portions 12 in plan view. The first non-woven fabric layer 92 or the second non-woven fabric layer 91 may be arranged across the entire surface of the component mount board 100, or be selectively arranged in a partial region of the component mount board 100.

Further, an adhesive sheet (adhesive layer 94) is provided on at least one of the surface (lower surface in FIGS. 10(*a*) and 10(*b*)) of the first non-woven fabric layer 92 opposite to the board 10 side or the surface (upper surface in FIGS. 10(*a*) and 10(*b*)) of the second non-woven fabric layer 91 opposite to the second board 20 side.

With this configuration, the component mount board 100 can be easily attached to an attachment target with the adhesive sheet.

In the case of the present embodiment, the adhesive layer 94 is provided on the first non-woven fabric layer 92 among the first non-woven fabric layer 92 and the second non-woven fabric layer 91.

The adhesive layer 94 is provided, for example, on the first non-woven fabric layer 92 in the form of a double-sided tape 93 with a release sheet 95. With this configuration, the release sheet 95 is detached from the adhesive layer 94 of the double-sided tape 93, and in this manner, the component mount board 100 can be attached to the attachment target with the adhesive layer 94.

The adhesive layer 94 is preferably not soluble in liquid. With this property, dropping of the component mount board 100 from the attachment target even when the component mount board 100 contacts liquid can be reduced.

Third missing portions 93*a* corresponding to the missing portions 12 are formed in the adhesive layer 94. With this configuration, liquid can be supplied to the missing portion 12 through the third missing portion 93*a*, and the second base 21, the second conductive pattern 40, and the soluble layer 22 can be easily dissolved.

The third missing portion 93*a* preferably fully includes the missing portion 12 in plan view.

The component mount board 100 according to the present embodiment is attached, as one example, to a water absorbing product (e.g., paper diaper 300 shown in FIG. 11) capable of absorbing liquid. Note that FIG. 11 shows the surface of the paper diaper 300 on the side of contact with the skin of a wearer.

When the wearer urinates in the paper diaper 300 and the second base 21, the second conductive pattern 40, and the soluble layer 22 are dissolved in the urine, such a state is sensed so that urination of the wearer can be sensed. That is, the component mount board 100 is utilized as a urination sensor that notifies a carer of the timing of replacement of the paper diaper 300.

Figure 11:
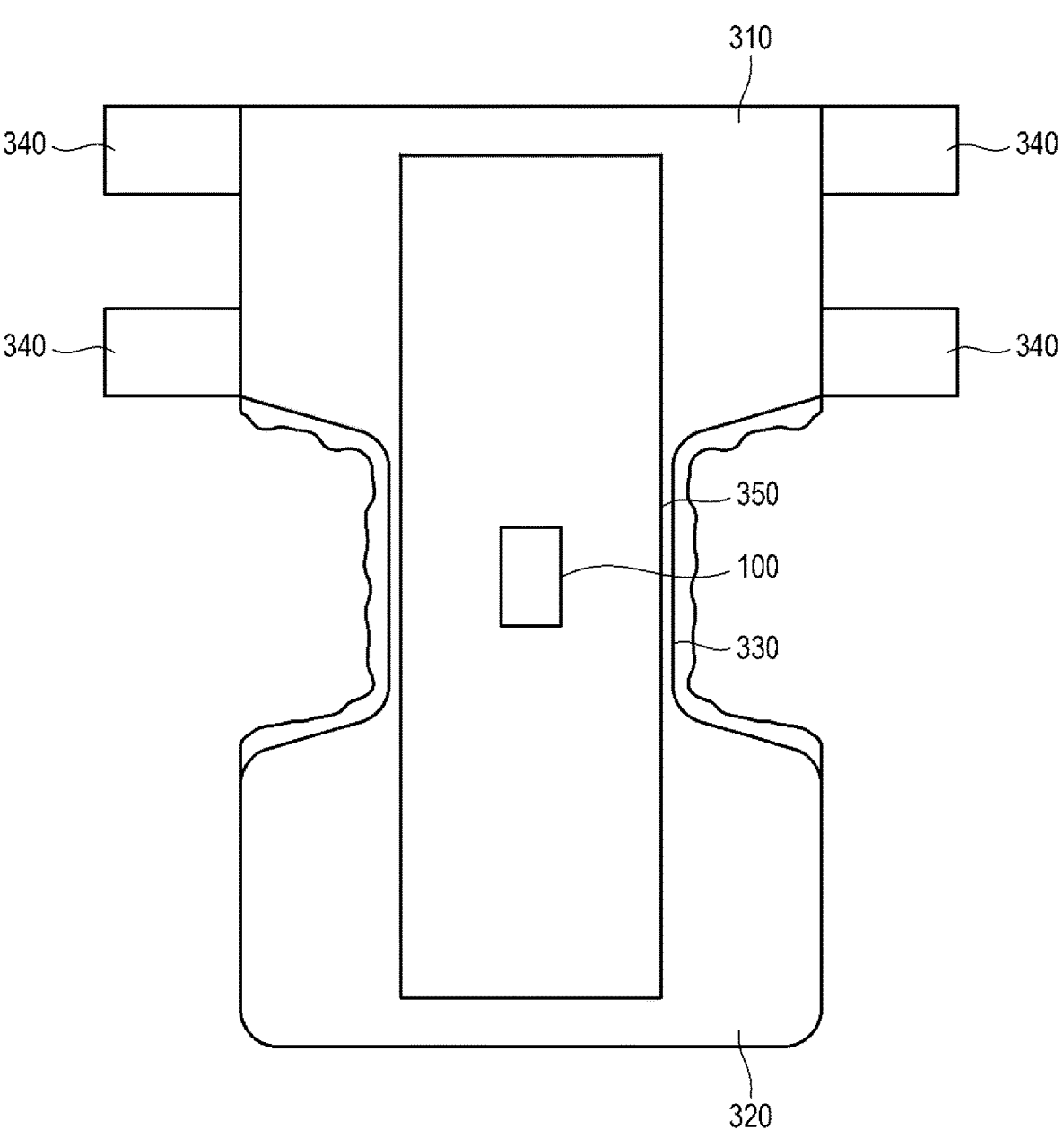
FIG. 11 is a schematic development view of a paper diaper including the component mount board according to the third embodiment.

The paper diaper 300 includes, for example, a back portion 310 arranged on the back side of the wearer, a front portion 320 arranged on the belly side of the wearer, a coupling portion 330 coupling the back portion 310 and the front portion 320 to each other, and multiple hook-and-loop fastener portions 340 formed at side portions of the back portion 310, as shown in FIG. 11. Both side portions of the back portion 310 and both side portions of the front portion 320 are coupled to each other through the hook-and-loop fastener portions 340 so that the wearer can wear the paper diaper 300.

An absorber 350 capable of absorbing liquid is formed on the surface of the paper diaper 300 on the side of contact with the skin of the wearer.

The absorber 350 extends, for example, in the front-back direction over the back portion 310, the front portion 320, and the coupling portion 330.

In a state in which the wearer wears the paper diaper 300, the absorber 350 is arranged at a location where the absorber 350 contacts the excretion part of the wearer. When the wearer urinates, the urine is absorbed by the absorber 350.

The component mount board 100 is preferably arranged, for example, on the surface of the absorber 350 on the side of contact with the skin of the wearer.

With the above-described third missing portions 93*a*, the urine can be discharged (not to the body side) to the paper diaper 300 side, and therefore, a wearer's uncomfortable feeling can be reduced.

Note that FIGS. 10(*a*) and 10(*b*) show the example where the first non-woven fabric layer 92, the second non-woven fabric layer 91, and the adhesive layer 94 (double-sided tape 93) are further provided in addition to the configuration of the component mount board 100 according to the first embodiment. However, the component mount board 100 may include the first non-woven fabric layer 92, the second non-woven fabric layer 91, and the adhesive layer 94 (double-sided tape 93) in addition to the configuration of the component mount board 100 according to the second embodiment.

The water absorbing product to which the component mount board 100 is attached is not limited to the paper diaper 300, and for example, may be a urine pad (not shown) attached to underwear.

Fourth Embodiment

Next, a fourth embodiment will be described using FIGS. 14 and 15.

A component mount board 100 according to the present embodiment is different from the component mount board 100 according to the first embodiment described above on the following points, and is configured similarly to the component mount board 100 according to the first embodiment described above on the other points.

Figure 14:
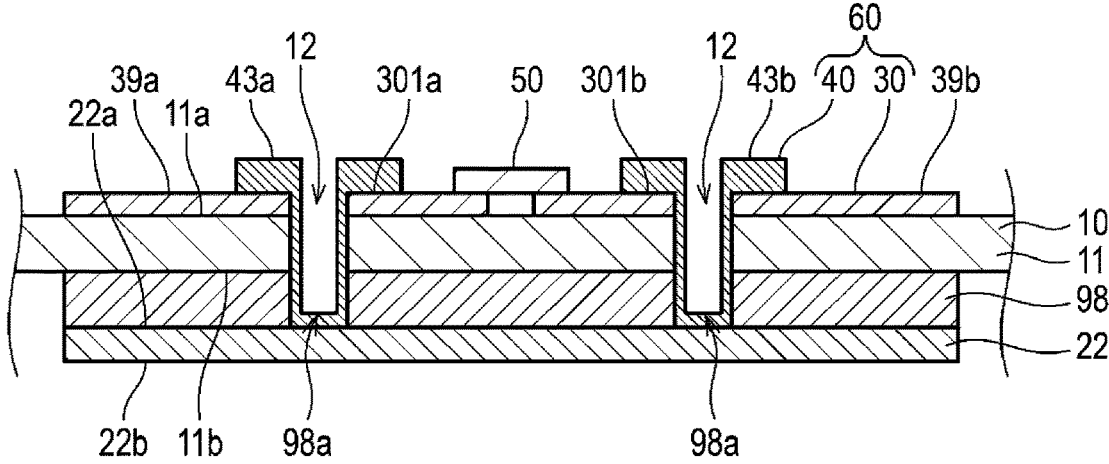
FIG. 14 is an end view of a component mount board according to a fourth embodiment.
Figure 15:
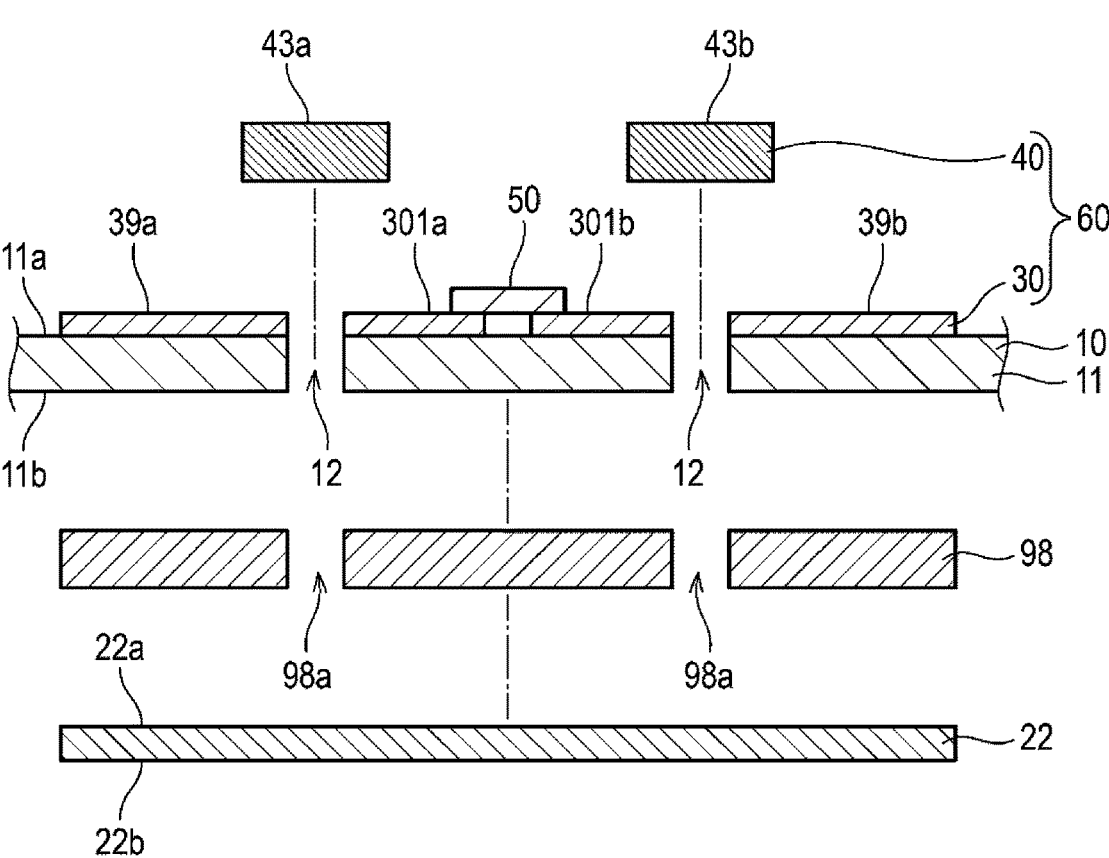
FIG. 15 is an exploded end view of the component mount board according to the fourth embodiment.

In the case of the present embodiment, the soluble layer 22 is formed on the surface (other surface 11*b*) of the base 11 opposite to the surface on which the first conductive pattern 30 is formed, as shown in FIGS. 14 and 15. In other words, the soluble layer 22 soluble in liquid is formed on the surface (other surface 11*b*) of the base 11 opposite to the surface on which the first conductive pattern 30 is formed.

The component mount board 100 includes no second base 21, and the second conductive pattern 40 is formed over the first conductive pattern 30 and the soluble layer 22.

According to this configuration, when the surface (other surface 11*b* side surface) of the component mount board 100 opposite to the side on which the first conductive pattern 30 is formed is soaked in liquid, the liquid can sufficiently contact the soluble layer 22 and therefore the second conductive pattern 40. Thus, a state of the component mount board 100 being soaked in liquid can be more reliably sensed.

As shown in FIGS. 14 and 15, the soluble layer 22 is arranged on the other surface 11*b* side of the base 11, and on the other hand, part of the second conductive pattern 40 is stacked on the first conductive pattern 30. In other words, the board 10 including the base 11 and the first conductive pattern 30 is arranged, in the up-down direction, between the part of the second conductive pattern 40 and the soluble layer 22.

Further, in the case of the present embodiment, a double-sided tape 98 is directly stacked on one surface 22*a* of the soluble layer 22, and the soluble layer 22 is joined to the base 11 through the double-sided tape 98.

A portion of the double-sided tape 98 corresponding to the second conductive pattern 40 is a fourth missing portion 98*a* where the double-sided tape 98 is missing. The second conductive pattern 40 is arranged, for example, over the missing portion 12 and the fourth missing portion 98*a*.

The fourth missing portion 98*a* is formed, for example, in the same shape as that of the missing portion 12 in plan view. In plan view, a region where the fourth missing portion 98*a* is present is coincident with a region where the missing portion 12 is present.

More specifically, the fourth missing portion 98*a* is an opening formed in the double-sided tape 98. The double-sided tape 98 has, for example, a pair of right and left fourth missing portions 98*a*. The left fourth missing portion 98*a* corresponds to the left missing portion 12, and the right fourth missing portion 98*a* corresponds to the right missing portion 12.

The second conductive pattern 40 is formed, for example, across a peripheral edge portion of the missing portion 12 in the board 10, the inner surface of the missing portion 12, the inner surface of the fourth missing portion 98*a*, and one surface 22*a* of the soluble layer 22.

For example, as shown in FIG. 14, the bridge portion 43*a* of the second conductive pattern 40 extends, in plan view, across part of a peripheral edge portion of the left missing portion 12, part of the inner peripheral surface of such a missing portion 12, part of the inner peripheral surface of the left fourth missing portion 98*a*, a portion of one surface 22*a* of the soluble layer 22 corresponding to such a missing portion 12, and another portion of the peripheral edge portion of such a missing portion 12. Similarly, the bridge portion 43*b* extends, in plan view, across part of a peripheral edge portion of the right missing portion 12, part of the inner peripheral surface of such a missing portion 12, part of the inner peripheral surface of the right fourth missing portion 98*a*, a portion of one surface 22*a* of the soluble layer 22 corresponding to the missing portion 12, and another portion of the peripheral edge portion of such a missing portion 12, for example.

With this configuration, in the case of the present embodiment, the bridge portion 43*a* also electrically connects the annular pattern forming portion 39*a* and the annular pattern forming portion 301*a* to each other. Similarly, the bridge portion 43*b* electrically connects the annular pattern forming portion 301*b* and the annular pattern forming portion 39*b* to each other.

In the case of the present embodiment, when the second conductive pattern 40 is formed, the second conductive pattern 40 is formed, by printing, on the board 10 to which the soluble layer 22 is bonded in advance through the double-sided tape 98.

Modification of Fourth Embodiment

Next, a modification of the fourth embodiment will be described using FIG. 16.

In the case of the present modification, the component mount board 100 is different from the component mount board 100 according to the fourth embodiment described above in that the second conductive pattern 40 is electrically connected to the first conductive pattern 30 through water-insoluble conductive paste 65 interposed between the second conductive pattern 40 and the first conductive pattern 30, and is configured similarly to the component mount board 100 according to the fourth embodiment described above on the other points.

According to this configuration, connection resistance between the second conductive pattern 40 and the first conductive pattern 30 can be further decreased. Thus, a better state of conduction between the first conductive pattern 30 and the second conductive pattern 40 can be brought.

More specifically, the conductive paste 65 is preferably interposed between each of the above-described bridge portions 41*a*, 41*b*, 42*a*, 42*b*, 43*a*, 43*b* and the component mount wiring portion corresponding to each of the bridge portions 41*a* to 43*b*, for example.

In the example shown in FIG. 16, the conductive paste 65 is interposed between the bridge portion 43*a* and the annular pattern forming portion 39*a* and between the bridge portion 43*a* and the annular pattern forming portion 301*a*, for example. Similarly, the conductive paste 65 is interposed between the bridge portion 43*b* and the annular pattern forming portion 39*b* and between the bridge portion 43*b* and the annular pattern forming portion 301*b*, for example.

With this configuration, the bridge portion 43*a* favorably electrically connects the annular pattern forming portion 39*a* and the annular pattern forming portion 301*a* to each other, and the bridge portion 43*b* favorably electrically connects the annular pattern forming portion 301*b* and the annular pattern forming portion 39*b* to each other.

Note that although not shown in the figure, the conductive paste 65 may be interposed between the bridge portion 41*a* and the linear pattern forming portion 33*a,* between the bridge portion 41*a* and the linear pattern forming portion 34*a,* between the bridge portion 41*b* and the linear pattern forming portion 34*b,* and between the bridge portion 41*b* and the linear pattern forming portion 33*b,* for example. Similarly, the conductive paste 65 may be interposed between the bridge portion 42*a* and the annular pattern forming portion 37*a,* between the bridge portion 42*a* and the annular pattern forming portion 36*a,* between the bridge portion 42*b* and the annular pattern forming portion 36*b,* and between the bridge portion 42*b* and the annular pattern forming portion 37*b,* for example.

The conductive paste 65 contains, for example, conductive particles with a particle size of 1 μm or more and 5 μm or less and thermosetting resin. The conductive particle is formed, as one example, in such a manner that the surface of a silver particle or a core made of silica is coated with silver.

In the case of the present modification, when the conductive paste 65 is formed, thermal treatment (drying) is performed for the conductive paste 65 after the conductive paste 65 has been printed. In a case where the first conductive pattern 30 is made of aluminum, an aluminum oxide film (not shown) is sometimes formed on the surface of the first conductive pattern 30.

According to the present modification, when the thermal treatment is performed for the conductive paste 65, stress is generated due to shrinkage of the thermosetting resin contained in the conductive paste 65 in a region where the conductive paste 65 is formed on the surface of the first conductive pattern 30. Therefore, the above-described aluminum oxide film can be broken in this formation region. Thus, the second conductive pattern 40 can be favorably electrically connected to the first conductive pattern 30 through the conductive paste 65.

Fifth Embodiment

Next, a fifth embodiment will be described using FIGS. 17 to 19. Note that FIGS. 17 and 19 show, as one example, a state of a component mount board 100 being attached to a paper diaper 300.

The component mount board 100 according to the present embodiment is different from the component mount boards 100 according to the fourth embodiment and the modification thereof as described above on the following points, and is configured similarly to the component mount boards 100 according to the fourth embodiment and the modification thereof as described above on the other points.

Figure 19:
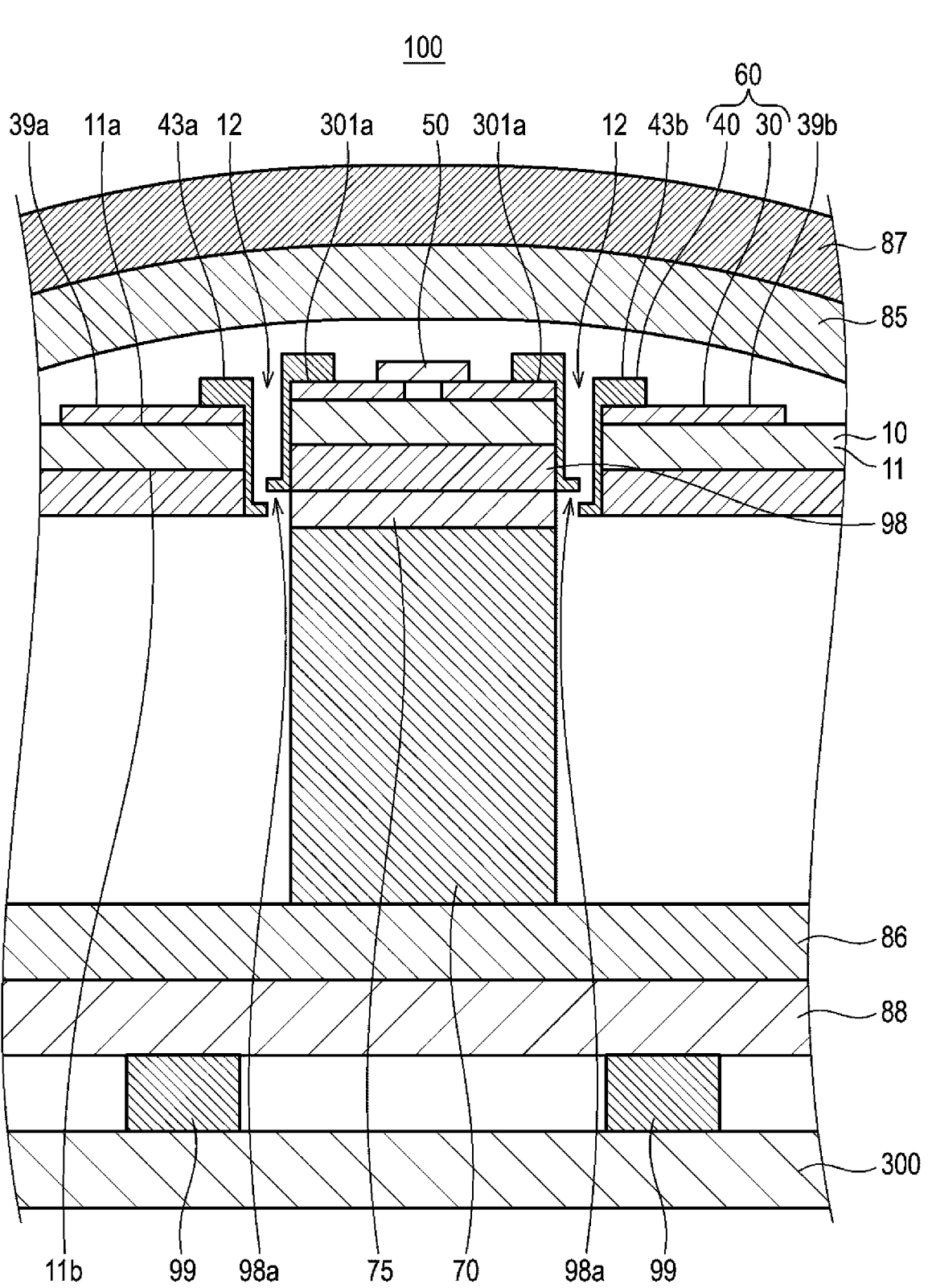
FIG. 19 is an end view of the component mount board according to the fifth embodiment, and shows a state in which a water-absorption expansion material is expanded.

In the case of the present embodiment, the component mount board 100 further includes a water-absorption expansion material 70 as shown in FIGS. 17 and 19. When expanding by water absorption, the water-absorption expansion material 70 presses the base 11 or the second conductive pattern 40 in the direction perpendicular to the plane of the base 11, thereby breaking the second conductive pattern 40.

According to the present embodiment, the component mount board 100 includes the water-absorption expansion material 70 expandable by water absorption, and the expanded water-absorption expansion material 70 presses the base 11 or the second conductive pattern 40 in the direction perpendicular to the plane of the base 11.

Accordingly, external force is applied to the second conductive pattern 40, and therefore, the second conductive pattern 40 is broken. A state of the component mount board 100 being soaked in liquid can be sensed in such a manner that occurrence of breakage of the second conductive pattern 40 is indirectly detected by detection of a change in the properties of the circuit 60 (e.g., mainly loss of the function of the circuit 60).

Further, the portion of the base 11 corresponding to the second conductive pattern 40 is the missing portion 12. That is, it is configured such that part of the second conductive pattern 40 is not protected by the base 11. Thus, the second conductive pattern 40 can be more reliably broken by the water-absorption expansion material 70. In addition, liquid can be sufficiently supplied to the water-absorption expansion material 70 through the missing portion 12, and therefore, the water-absorption expansion material 70 can sufficiently expand by water absorption.

As described above, according to the present embodiment, the state of the component mount board 100 being soaked in liquid can be more reliably sensed.

The water-absorption expansion material 70 is, as one example, a compressed cellulose sponge. Note that the present invention is not limited to this example. The water-absorption expansion material 70 may be, for example, a member expandable by water absorption other than the compressed cellulose sponge, such as water absorbing polymer.

The water-absorption expansion material 70 is bonded to the other surface 22*b* of the soluble layer 22 through a double-sided tape 75, for example.

Figure 18:
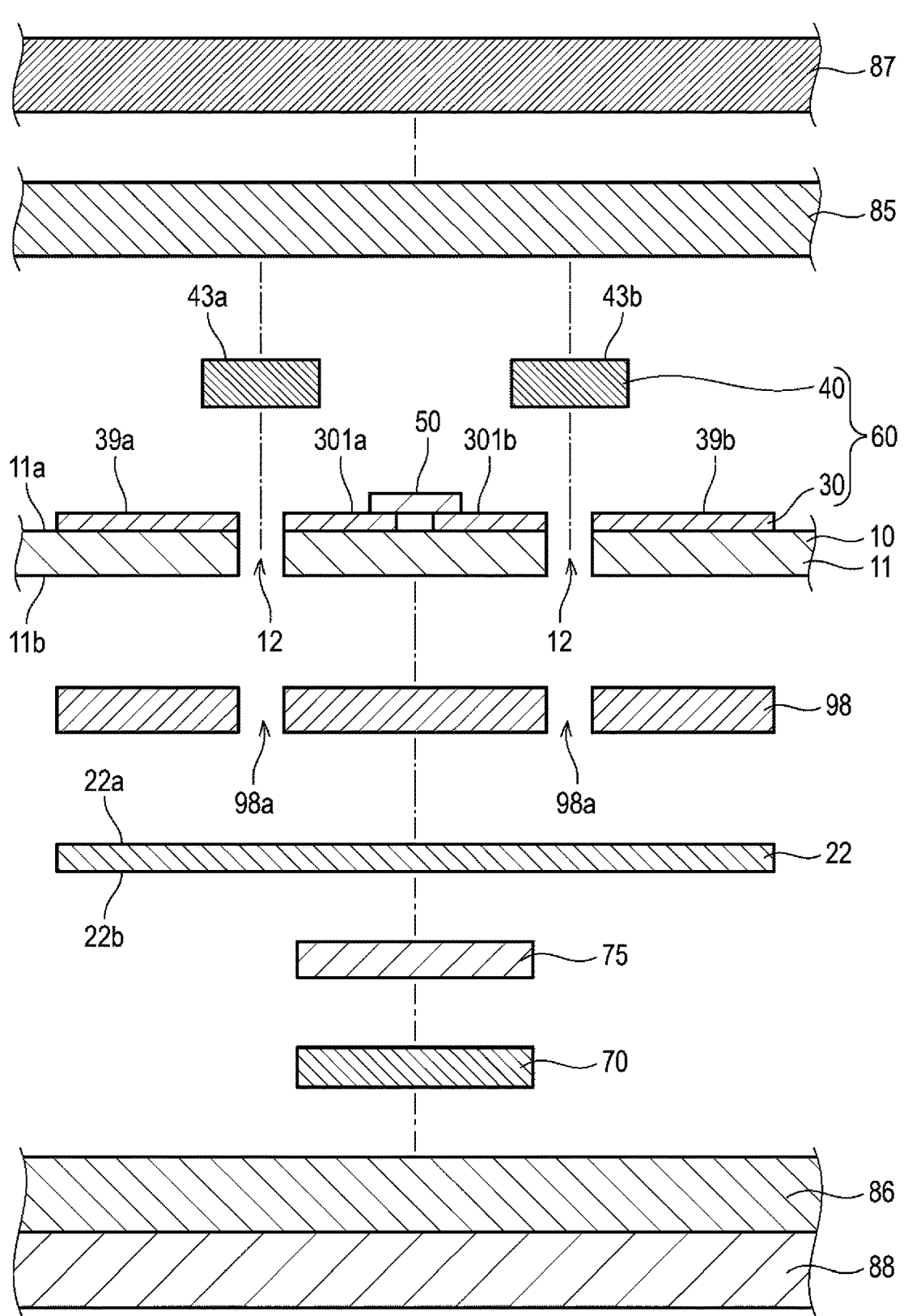
FIG. 18 is an exploded end view of the component mount board according to the fifth embodiment.

As shown in FIGS. 17 and 18, the component mount board 100 includes, for example, a first water-conducting sheet 85 arranged on the one surface 11*a* side of the base 11 and a second water-conducting sheet 86 arranged on the opposite side of the water-absorption expansion material 70 from one surface 11*a* of the base 11.

With this configuration, each of the first water-conducting sheet 85 and the second water-conducting sheet 86 can absorb liquid (e.g., water), and therefore, the liquid can be sufficiently supplied to the second conductive pattern 40, the soluble layer 22, and the water-absorption expansion material 70.

Each of the first water-conducting sheet 85 and the second water-conducting sheet 86 is preferably arranged at least in a region including the water-absorption expansion material 70 in plan view. Each of the first water-conducting sheet 85 and the second water-conducting sheet 86 may be arranged across the entire surface of the component mount board 100, or be selectively arranged in a partial region of the component mount board 100. In the case of the present embodiment, each of the first water-conducting sheet 85 and the second water-conducting sheet 86 is arranged, as one example, in a region including the entirety of the first conductive pattern 30 in plan view.

Further, the component mount board 100 includes, for example, a first restraining sheet (later-described first water permeable sheet 87 in the case of the present embodiment) arranged on the one surface 11*a* side of the board 10 and a second restraining sheet (later-described second water permeable sheet 88 in the case of the present embodiment) arranged on the other surface 11*b* side. The first restraining sheet and the second restraining sheet restrain at least the periphery of a region, where the second conductive pattern 40 is arranged, of the board 10. In the case of the present embodiment, as one example, the first restraining sheet and the second restraining sheet restrain at least the periphery of a region, where the first conductive pattern 30 is arranged, of the board 10.

Note that the periphery of the region where the second conductive pattern 40 is arranged is the periphery of a region including the entirety of the missing portion 12.

According to such a configuration, as shown in FIG. 19, the water-absorption expansion material 70 presses part of the base 11 to relatively displace two portions of the base 11 sandwiching the missing portion 12. More specifically, the expanded water-absorption expansion material 70 presses, for example, a portion of the base 11 between the left missing portion 12 and the right missing portion 12 in the direction (above in FIG. 8 in the case of the present embodiment) perpendicular to the plane of the base 11. Accordingly, the portion of the base 11 between the left missing portion 12 and the right missing portion 12 displaces upward with respect to other portions of the base 11.

As a result, the bridge portions 41*a*, 42*a*, 43*a* arranged over the left missing portion 12 and the bridge portions 41*b*, 42*b*, 43*b* arranged over the right missing portion 12 are broken.

Note that in the example shown in FIG. 19, a state of the entirety of the soluble layer 22 being dissolved is shown.

In the case of the present embodiment, the component mount board 100 includes, for example, the first water permeable sheet 87 which is the first restraining sheet and the second water permeable sheet 88 which is the second restraining sheet.

With this configuration, the first water permeable sheet 87 or the second water permeable sheet 88 can quickly supply liquid to the second conductive pattern 40, the soluble layer 22, and the water-absorption expansion material 70. More specifically, the first water permeable sheet 87 or the second water permeable sheet 88 can quickly supply liquid to the second conductive pattern 40, the soluble layer 22, and the water-absorption expansion material 70 both in a case where the surface of the component mount board 100 on the side on which the first water permeable sheet 87 is arranged is mainly soaked in liquid and a case where the surface of the component mount board 100 on the side on which the second water permeable sheet 88 is arranged is mainly soaked in liquid.

The first water permeable sheet 87 is stacked above the first water-conducting sheet 85, and the second water permeable sheet 88 is arranged below the second water-conducting sheet 86, for example.

For example, in a case where the component mount board 100 is attached to a water absorbing product (e.g., paper diaper 300 shown in FIGS. 17 and 19) capable of absorbing liquid, the second water permeable sheet 88 is attached to such a water absorbing product through a double-sided tape 99 (or a hook-and-loop fastener portion).

Each of the first water-conducting sheet 85 and the second water-conducting sheet 86 is, but not specifically limited to, high water-absorption (water-holding) rayon non-woven fabric as one example, and the basis weight thereof is, for example, 40 g/m² or more and 80 g/m² or less and preferably 50 g/m² or more and 70 g/m² or less. Note that each of the first water-conducting sheet 85 and the second water-conducting sheet 86 may be, for example, pulp, cotton, or hemp.

Each of the first water permeable sheet 87 and the second water permeable sheet 88 is, but not specifically limited to, non-woven fabric made of polyester, polypropylene, or polyethylene terephthalate and having a basis weight of 5 g/m² or more and 100 g/m² or less and preferably 10 g/m² or more and 50 g/m² or less, as one example. With this configuration, the water permeability of each of the first water permeable sheet 87 and the second water permeable sheet 88 can be favorably ensured.

Each embodiment has been described above with reference to the drawings. These embodiments are examples of the present invention, and various configurations other than those described above can also be employed.

For example, in the examples described above, the mount component 50 is the RFID chip. However, the present invention is not limited to these examples. The mount component 50 may be another electronic component such as a capacitor or a resistor. The component mount board 100 may be applied not only to the RFID tag but also to near field communication (NFC), for example.

Figure 12:
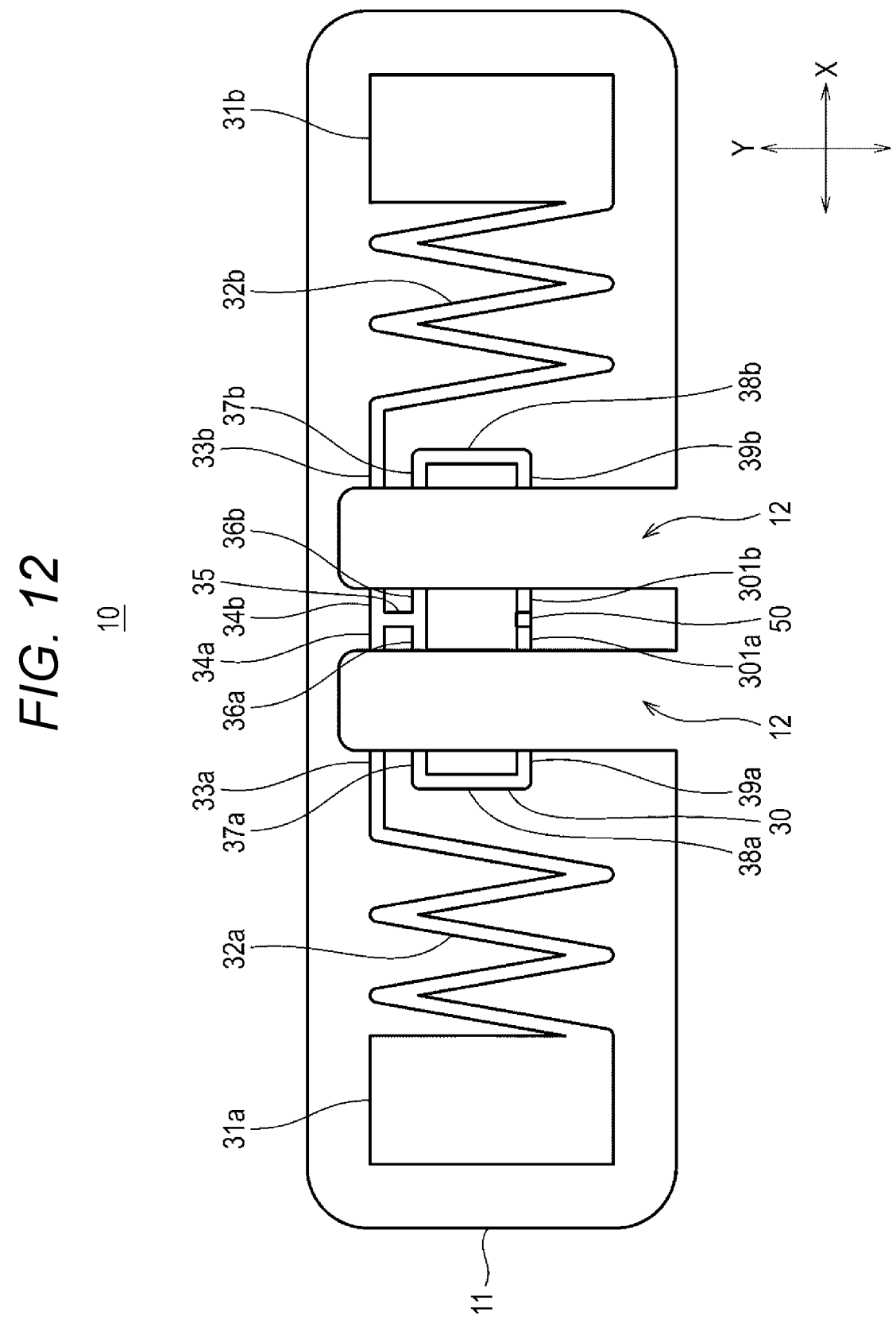
FIG. 12 is a plan view showing a first modification of a board.

In the examples described above, the missing portion 12 is the opening, but as shown in, e.g., FIG. 12, the missing portion 12 may be the cutout-shaped portion formed in the base 11.

Figure 13:
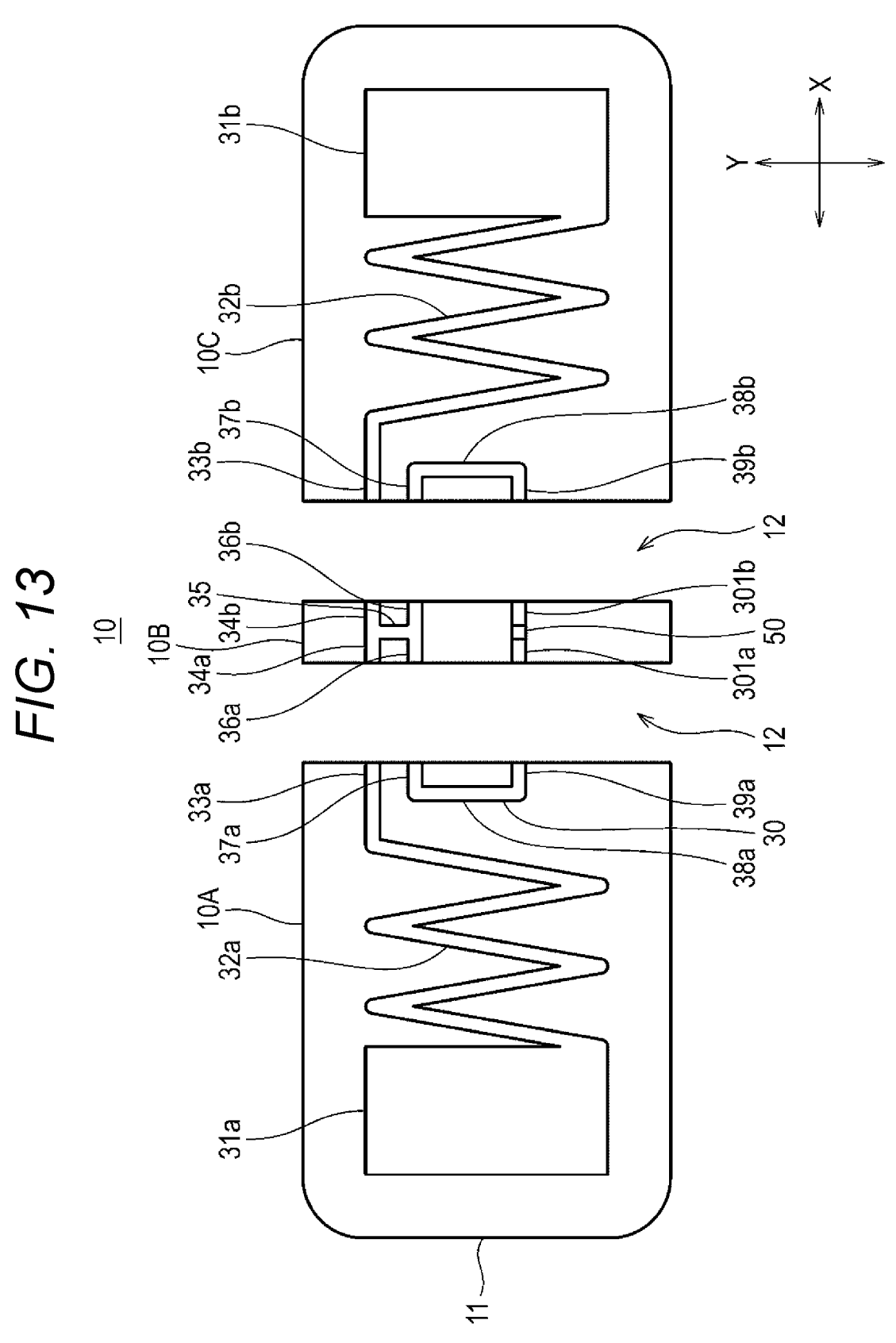
FIG. 13 is a plan view showing a second modification of the board.

Alternatively, as shown in FIG. 13, the board 10 is divided into multiple portions (e.g., three portions of a first portion 10A, a second portion 10B, and a third portion 10C), and a clearance between these portions may be the missing portion 12.

In the examples described above, the second conductive pattern 40 is bridged between the first portion of the first conductive pattern 30 and the second portion which is the portion of the first conductive pattern 30 apart from the first portion with the missing portion 12 interposed therebetween. However, the present invention is not limited to these examples. The second conductive pattern 40 is not necessarily bridged over the first conductive pattern 30, and may be merely connected to the first conductive pattern 30. As one simple example, the left half of the circuit 60 shown in FIG. 1 is formed by the first conductive pattern 30, and the right half is formed by the second conductive pattern 40.

The present embodiments include the following technical ideas.

(1) A component mount board including:

a board including a base, a first conductive pattern formed on the base, and a mount component electrically connected to the first conductive pattern; and a second conductive pattern forming a circuit together with the first conductive pattern in a complementary manner, in which a portion of the base corresponding to the second conductive pattern is a missing portion where the base is missing, and the second conductive pattern is soluble in liquid, or is weakened when becoming wet with liquid.

(2) The component mount board according to (1), in which a portion of the second conductive pattern facing the missing portion is a wiring portion forming the circuit.

(3) The component mount board according to (1) or (2), in which the missing portion is an opening or a cutout-shaped portion formed in the base.

(4) The component mount board according to any one of (1) to (3), in which the second conductive pattern is arranged over the missing portion, and is bridged between a first portion of the first conductive pattern and a second portion which is a portion of the first conductive pattern apart from the first portion with the missing portion interposed therebetween to electrically connect the first portion and the second portion to each other.

(5) The component mount board according to any one of (1) to (4), in which the liquid contains water, the second conductive pattern is made of water-soluble conductive paste, the first conductive pattern is made of metal foil, and the second conductive pattern is electrically connected to the first conductive pattern through water-insoluble conductive paste interposed between the second conductive pattern and the first conductive pattern.

(6) The component mount board according to any one of (1) to (4), in which the second conductive pattern contains resin having a hot melt property, and is electrically and mechanically connected to the first conductive pattern by being hot-melt joined to the first conductive pattern.

(7) The component mount board according to any one of (1) to (6), in which the base is not soluble in the liquid.

(8) The component mount board according to any one of (1) to (7), in which the first conductive pattern is not soluble in the liquid.

(9) The component mount board according to any one of (1) to (8), further including:

a second base arranged so as to face the base, in which the second conductive pattern is formed on the second base.

(10) The component mount board according to (9), in which:

a soluble layer, which is an adhesive layer soluble in the liquid, is formed on a surface of the second base facing the base, and the second conductive pattern is formed on the second base through the soluble layer.

(11) The component mount board according to (9), in which the second conductive pattern is directly formed on the second base, the base and the second base are bonded to each other through an adhesive sheet or a bonding sheet, and a region of the second base including a region where the second conductive pattern is formed faces the missing portion through a second missing portion formed in the adhesive sheet or the bonding sheet.

(12) The component mount board according to any one of (9) to (11), further including:

at least one of a first non-woven fabric layer arranged along a surface of the base opposite to a second base side or a second non-woven fabric layer arranged along a surface of the second base opposite to a base side.

(13) The component mount board according to (12), in which an adhesive sheet is provided on at least one of a surface of the first non-woven fabric layer opposite to the base side or a surface of the second non-woven fabric layer opposite to the second base side.

(14) The component mount board according to any one of (1) to (8), in which:

a soluble layer soluble in the liquid is formed on a surface of the base opposite to a surface on which the first conductive pattern is formed.

(15) The component mount board according to any one of (1) to (14), in which a location of an end of the first conductive pattern and a location of an end of the missing portion are coincident with each other.

(16) The component mount board according to any one of (1) to (14), in which an end of the first conductive pattern close to the missing portion is apart from an end of the missing portion.

LIST OF REFERENCE SIGNS

10 Board
10A First Portion
10B Second Portion
10C Third Portion
11 Base
11a One Surface
11b Other Surface
12 Missing Portion
12a End
20 Second Board
21 Second Base
21a One Surface
21b Other Surface
22 Soluble Layer
30 First Conductive Pattern
30a, 30b End
31a, 31b Wide Portion
32a, 32b Zigzag Portion
33a, 33b, 34a, 34b Linear Pattern Forming Portion
35 Coupling Portion
36a, 36b, 37a, 37b, 38a, 38b, 39a, 39b, 301a, 301b Annular Pattern Forming Portion
40 Second Conductive Pattern
41a, 41b, 42a, 42b, 43a, 43b Bridge Portion
50 Mount Component
60 Circuit
65 Conductive Paste
70 Water-Absorption Expansion Material
75 Double-Sided Tape
80 Joining Sheet (Adhesive Sheet, Bonding Sheet)
81 Second Missing Portion
85 First Water-Conducting Sheet
86 Second Water-Conducting Sheet
87 First Water Permeable Sheet
88 Second Water Permeable Sheet
91 Second Non-Woven Fabric Layer
92 First Non-Woven Fabric Layer
93 Double-Sided Tape
93a Third Missing Portion
94 Adhesive Layer
95 Release Sheet
98, 99 Double-Sided Tape
98a Fourth Missing Portion
100 Component Mount Board
110 Cutting Blade
300 Paper Diaper
310 Back Portion
320 Front Portion
330 Coupling Portion
340 Hook-And-Loop Fastener Portion
350 Absorber

The invention claimed is:

1. A component mount board comprising:

a board including a base, a first conductive pattern formed on the base, and a mount component electrically connected to the first conductive pattern; and a second conductive pattern forming a circuit together with the first conductive pattern in a complementary manner, wherein a portion of the base corresponding to the second conductive pattern is a missing portion where the base is missing, and the second conductive pattern is soluble in liquid, or is weakened when becoming wet with liquid.

2. The component mount board according to claim 1, wherein a portion of the second conductive pattern facing the missing portion is a wiring portion forming the circuit.

3. The component mount board according to claim 1, wherein the missing portion is an opening or a cutout-shaped portion formed in the base.

4. The component mount board according to claim 1, wherein the second conductive pattern is arranged over the missing portion, and is bridged between a first portion of the first conductive pattern and a second portion which is a portion of the first conductive pattern apart from the first portion with the missing portion interposed therebetween to electrically connect the first portion and the second portion to each other.

5. The component mount board according to claim 1 wherein the liquid contains water, the second conductive pattern is made of water-soluble conductive paste, the first conductive pattern is made of metal foil, and the second conductive pattern is electrically connected to the first conductive pattern through water-insoluble conductive paste interposed between the second conductive pattern and the first conductive pattern.

6. The component mount board according to claim 1, wherein the second conductive pattern contains resin having a hot melt property, and is electrically and mechanically connected to the first conductive pattern by being hot-melt joined to the first conductive pattern.

7. The component mount board according to claim 1, wherein the base is not soluble in the liquid.

8. The component mount board according to claim 1, wherein the first conductive pattern is not soluble in the liquid.

9. The component mount board according to claim 1, further comprising:

a second base arranged so as to face the base, wherein the second conductive pattern is formed on the second base.

10. The component mount board according to claim 9, wherein:

a soluble layer, which is an adhesive layer soluble in the liquid, is formed on a surface of the second base facing the base, and the second conductive pattern is formed on the second base through the soluble layer.

11. The component mount board according to claim 9, wherein the second conductive pattern is directly formed on the second base, the base and the second base are bonded to each other through an adhesive sheet or a bonding sheet, and a region of the second base including a region where the second conductive pattern is formed faces the missing portion through a second missing portion formed in the adhesive sheet or the bonding sheet.

12. The component mount board according to claim 9, further comprising:

at least one of a first non-woven fabric layer arranged along a surface of the base opposite to a second base side or a second non-woven fabric layer arranged along a surface of the second base opposite to a base side.

13. The component mount board according to claim 12, wherein an adhesive sheet is provided on at least one of a surface of the first non-woven fabric layer opposite to the base side or a surface of the second non-woven fabric layer opposite to the second base side.

14. The component mount board according to claim 1, wherein:

a soluble layer soluble in the liquid is formed on a surface of the base opposite to a surface on which the first conductive pattern is formed.

15. The component mount board according to claim 1, wherein a location of an end of the first conductive pattern and a location of an end of the missing portion are coincident with each other.

16. The component mount board according to claim 1, wherein an end of the first conductive pattern close to the missing portion is apart from an end of the missing portion.

* * * * *